United States Patent
La Fratta et al.

(10) Patent No.: US 11,106,389 B2
(45) Date of Patent: *Aug. 31, 2021

(54) APPARATUSES AND METHODS FOR DATA TRANSFER FROM SENSING CIRCUITRY TO A CONTROLLER

(71) Applicant: Micron Technology, Inc., Boise, ID (US)

(72) Inventors: Patrick A. La Fratta, McKinney, TX (US); James J. Shawver, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 181 days.

This patent is subject to a terminal disclaimer.

(21) Appl. No.: 16/043,959

(22) Filed: Jul. 24, 2018

(65) Prior Publication Data

US 2018/0329648 A1 Nov. 15, 2018

Related U.S. Application Data

(63) Continuation of application No. 15/906,872, filed on Feb. 27, 2018, now Pat. No. 10,157,019, which is a (Continued)

(51) Int. Cl.
  *G06F 3/06* (2006.01)
  *G11C 7/10* (2006.01)
  (Continued)

(52) U.S. Cl.
  CPC ............ *G06F 3/0655* (2013.01); *G06F 3/061* (2013.01); *G06F 3/0673* (2013.01);
  (Continued)

(58) Field of Classification Search
  CPC .................................................. G06F 15/7821
  See application file for complete search history.

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Gary W. Cygiel
(74) *Attorney, Agent, or Firm* — Brooks, Cameron & Huebsch, PLLC

(57) ABSTRACT

The present disclosure describes data transfer in a memory device from sensing circuitry to controller. An example apparatus includes a controller coupled to a memory device. The controller is configured to execute a command to transfer data from a latch component to a register file in the controller. The memory device includes an array of memory cells and the latch component is coupled to rows of the array via a plurality of columns of the memory cells. The latch component includes a latch selectably coupled to each of the columns and configured to implement the command to transfer the data. The memory device includes a data line to couple the latch component to the register file to transfer the data. The controller is configured to couple to the data line and the register file to perform a write operation on the transferred data to the register file in the controller.

19 Claims, 8 Drawing Sheets

Related U.S. Application Data continuation of application No. 15/184,516, filed on Jun. 16, 2016, now Pat. No. 9,921,777.

(60) Provisional application No. 62/182,993, filed on Jun. 22, 2015.

(51) Int. Cl.
  *G11C 11/4076* (2006.01)
  *G11C 11/4091* (2006.01)
  *G11C 11/4097* (2006.01)
(52) U.S. Cl.
  CPC ........ *G11C 7/1006* (2013.01); *G11C 11/4076* (2013.01); *G11C 11/4091* (2013.01); *G11C 11/4097* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazarichuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shinano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |

(56) References Cited

U.S. PATENT DOCUMENTS

| | | |
|---|---|---|
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0200378 A1 | 10/2003 | Kirsch |
| 2003/0222879 A1 | 12/2003 | Lin et al. |
| 2004/0019756 A1* | 1/2004 | Perego ............... G11C 7/1045 711/170 |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0117155 A1* | 6/2006 | Ware ............... G11C 11/4097 711/163 |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0312998 A1 | 12/2010 | Walker |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0279466 A1 | 10/2015 | Manning |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

(56) References Cited

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (15 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

Farmahini-Farahani et al., NDA: Near-DRAM Acceleration Architecture Leveraging Commodity DRAM Devices and Standard Memory Modules, Feb. 7-11, 2015, 2015 IEEE 21st International Symposium on High Performance Computer Architecture (HPCA), Cover + pp. 283-295 (14 pages).

* cited by examiner

APPARATUSES AND METHODS FOR DATA TRANSFER FROM SENSING CIRCUITRY TO A CONTROLLER

PRIORITY INFORMATION

This application is a Continuation of U.S. application Ser. No. 15/906,872, filed Feb. 27, 2018, which is a Continuation of U.S. application Ser. No. 15/184,516, filed Jun. 16, 2016, which issued as U.S. Pat. No. 9,921,777 on Mar. 20, 2018, which claims the benefit of U.S. Provisional Application No. 62/182,993, filed Jun. 22, 2015, the contents of which are included herein by reference.

TECHNICAL FIELD

The present disclosure relates generally to semiconductor memory and methods, and more particularly, to apparatuses and methods for data transfer in a memory device from sensing circuitry to a controller.

BACKGROUND

Memory devices are typically provided as internal, semiconductor, integrated circuits in various computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in a computing system may be involved in providing instructions to the functional unit circuitry for execution. The instructions may be generated, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry may be external to the memory array, and data is accessed via a bus between the processing resources and the memory array to execute a set of instructions. Processing performance may be improved in a processing-in-memory device, in which a processor may be implemented internal and/or near to a memory (e.g., directly on a same chip as the memory array). A processing-in-memory device may save time by reducing and/or eliminating external communications and may also conserve power.

DETAILED DESCRIPTION

Figure 1A:
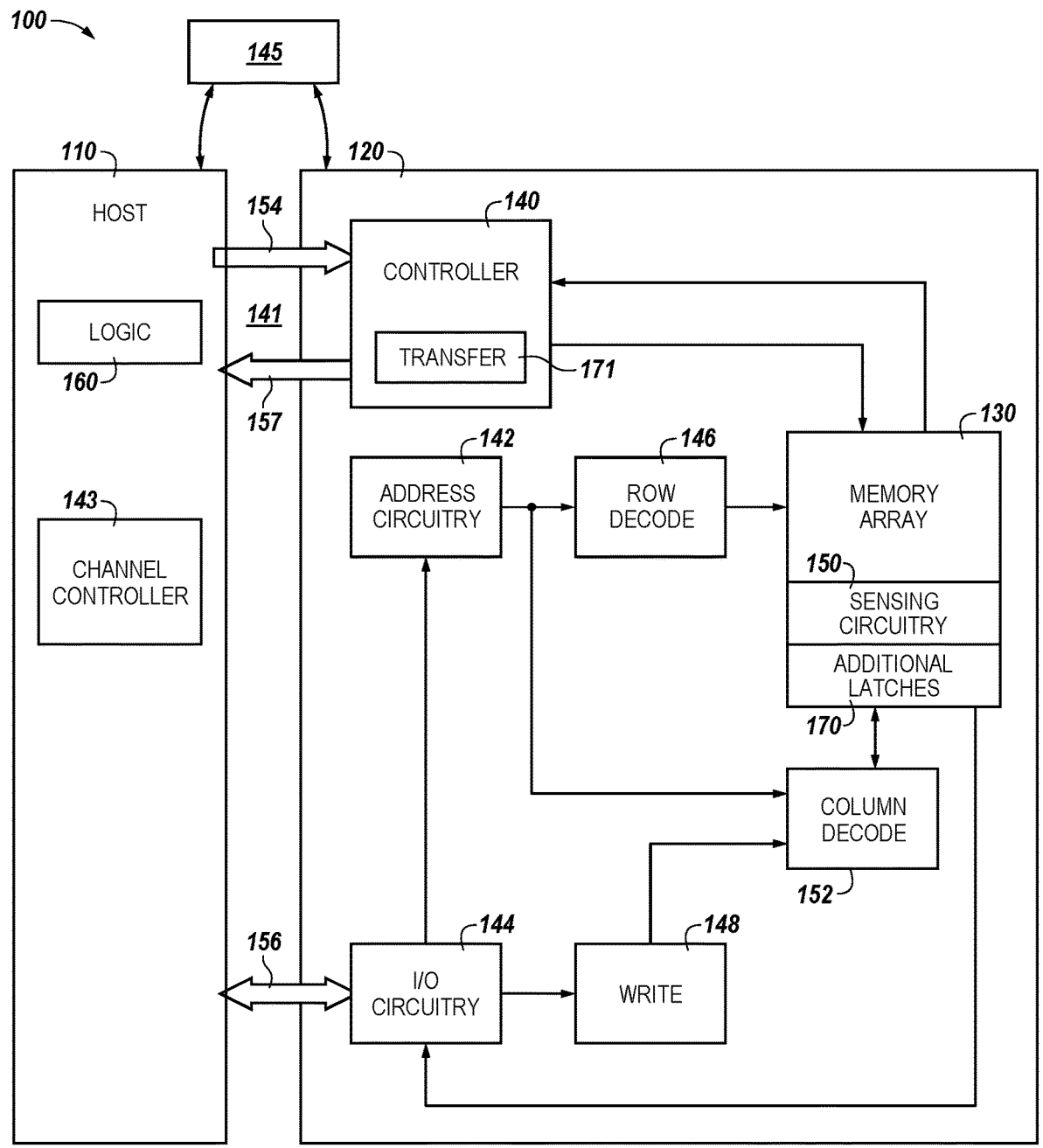
FIG. 1A is a block diagram of an apparatus in the form of a computing system including a memory device in accordance with a number of embodiments of the present disclosure.

The present disclosure includes apparatuses and methods for data transfer in a memory device from sensing circuitry to a controller. In at least one embodiment, an apparatus can include the controller coupled to the memory device. The controller is configured to execute a command to transfer data from a latch component to a register file in the controller. The memory device includes an array of memory cells and the latch component is coupled to rows of the array via a plurality of columns of the memory cells. The latch component includes a latch selectably coupled to each of the columns and configured to implement the command to transfer the data. The memory device includes a data line to couple the latch component to the register file to transfer the data. The controller is configured to couple to the data line and the register file to perform a write operation on the transferred data to the register file in the controller.

In at least one embodiment, a controller can be coupled to a bank of the memory device. The controller can be configured to execute a command to transfer data in the bank from a latch component to a register file in the controller. The bank can, in various embodiments, include an array of memory cells and the latch component can be coupled to rows of the array via a plurality of columns of the memory cells. The latch component can include a latch selectably coupled to each of the columns and configured to implement the command to transfer the data. In various embodiments, the bank can include a data line and/or a shared I/O line to couple the latch component to the register file to transfer the data. The controller can be configured to couple to the data line and/or the shared I/O line and the register file to perform a write operation on the data transferred to the register file in the controller.

The present disclosure describes an architectural design and a corresponding procedure for transferring data from sensing circuitry of a processing-in-memory (PIM) device to a register file located in the PIM device's controller 140. PIM capable device operations can use bit vector based operations. As used herein, the term "bit vector" is intended to mean a number of bits on a bit vector memory device (e.g., a PIM device) stored in a row of an array of memory cells and/or in sensing circuitry. Thus, as used herein a "bit vector operation" is intended to mean an operation that is performed on a bit vector that is a portion of virtual address space and/or physical address space (e.g., used by a PIM device). In some embodiments, the bit vector may be a physically contiguous number of bits on the bit vector memory device stored physically contiguous in a row and/or in the sensing circuitry such that the bit vector operation is performed on a bit vector that is a contiguous portion of the virtual address space and/or physical address space. For example, a row of virtual address space in the PIM device may have a bit length of 16K bits (e.g., corresponding to 16K complementary pairs of memory cells in a DRAM configuration). Sensing circuitry 150, as described herein, for such a 16K bit row may include a corresponding 16K processing elements (e.g., compute components, as described herein) formed on pitch with the sense lines selectably coupled to corresponding memory cells in the 16 bit row. A compute component in the PIM device may operate as a one bit processing element on a single bit of the bit vector of the row of memory cells sensed by the sensing circuitry 150 (e.g., sensed by and/or stored in a sense amplifier paired with the compute component, as described herein).

As used herein, sensing circuitry is intended to include a latch component configured to retrieve data (e.g., a register value) from the array and sense amplifiers used for other operations. The latch component can include a plurality of latches and the plurality of latches can each be configured with a store (cache) for retrieved data values, including the retrieved register value. As shown and described by way of example in connection with FIG. 1B, the plurality of latches can be located in a single latch stripe 172 on a periphery of a bank 123 of the memory device, whereas the sense amplifiers can be located in a plurality of sense amplifier stripes 124 that are each physically associated with a sub-array 125 of memory cells in the bank 123.

The transfer of data through the sensing circuitry (e.g., from a number of latches of the latch component) to a register file in the controller may improve performance of a number of operations directed by the controller. That is, without the transfer of data described herein, execution of instructions (e.g., from a host) by the controller to perform an operation that utilizes data that would be stored in memory cells of the array could involve accessing such data in the memory cells each time that particular operation is performed.

For instance, an operation that performs scalar operations on data in computations involving vectors could scale a vector by a constant scalar value (e.g., a register value) which may be stored in memory cells in a row of the bank. The present disclosure would enable transfer of the register value from the memory cells through the sensing circuitry (e.g., the latches of the latch component) into the register file located in the controller. For instance, such a register value could be copied from the register file across a number of latches and utilized in the PIM array for processing of multiplication operations using the constant scalar value without retrieving the register value from the memory cells each time.

Such a transfer of a register value to the register file also could be utilized when a control flow of a sequencer routine performed by the controller is dependent on a register value that is stored in memory cells of the bank. For instance, a loop counter (e.g., a register value) may be stored in the memory cells. The present disclosure would enable transfer of the register value to the register file of the controller where, for instance, the register value may be used as a boundary value for a number of iterations of a loop.

Another instance of transfer of a register value to the register file improving performance of an operation is when an operation includes performing a lookup into a list of function pointers for the address of a routine to be executed. When the function pointer (e.g., a register value) is found, this register value can be transferred to the register file of the controller to be utilized for executing the next routine without once again retrieving the register value from the memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 306 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present disclosure, and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, bank arbiter 145, high speed interface (HSI) 141, memory array 130, sensing circuitry 150, and/or a number of additional latches 170 might also be separately considered an "apparatus."

Figure 1B:
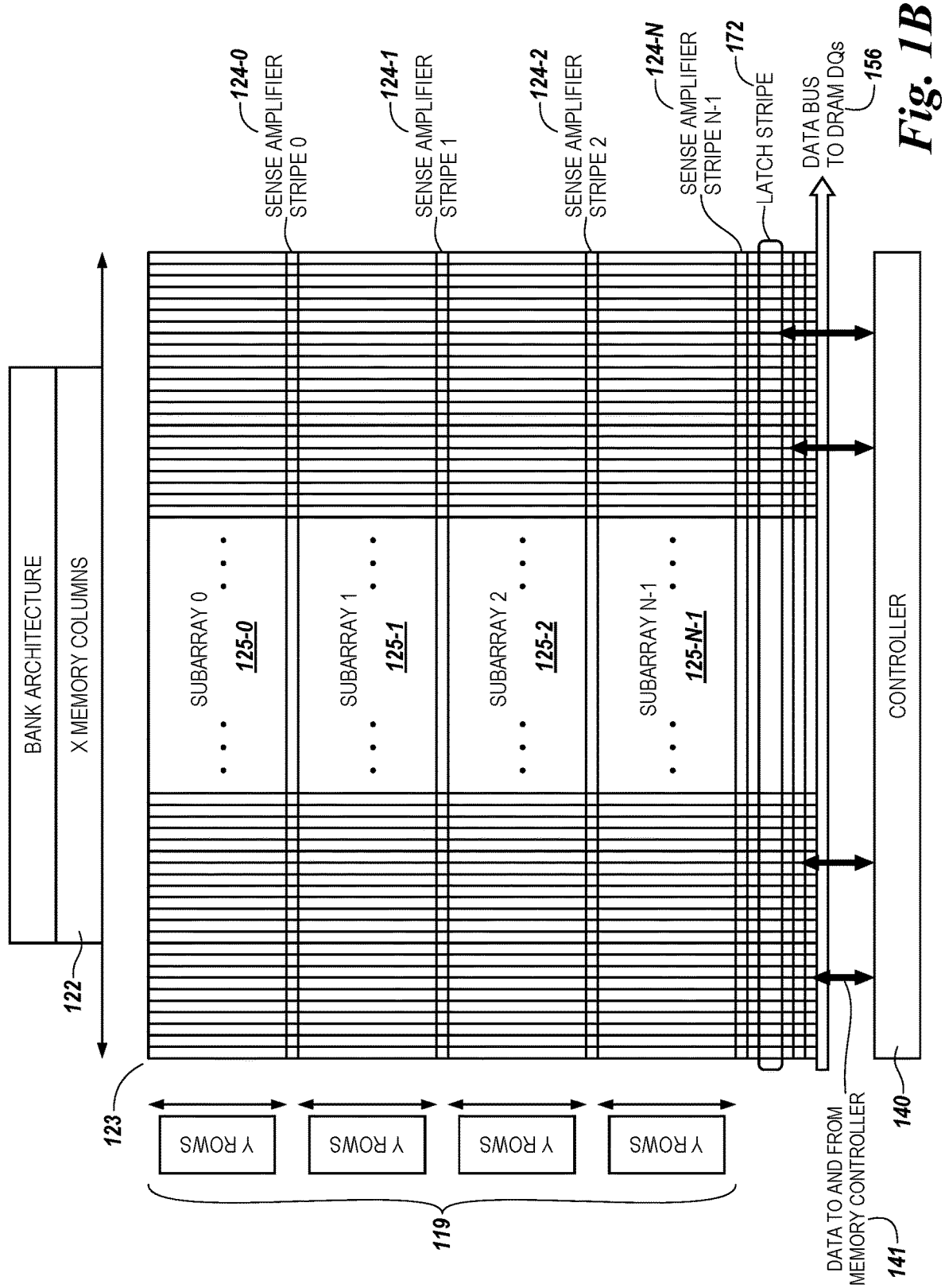
FIG. 1B is a block diagram of a bank section to a memory device in accordance with a number of embodiments of the present disclosure.
Figure 4A:
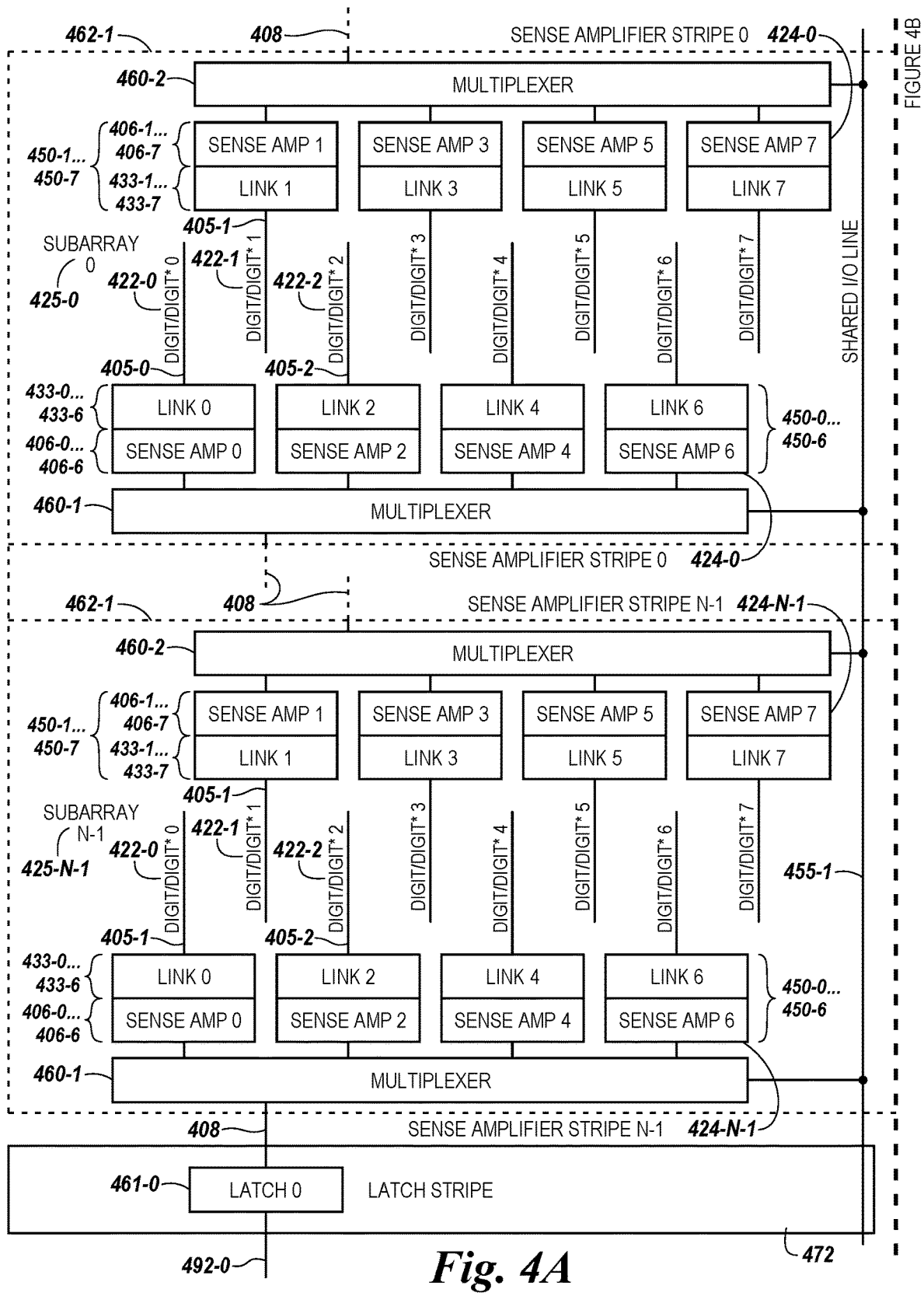
FIGS. 4A and 4B are another schematic diagram illustrating circuitry for data transfer in a memory device in accordance with a number of embodiments of the present disclosure.
Figure 4B:
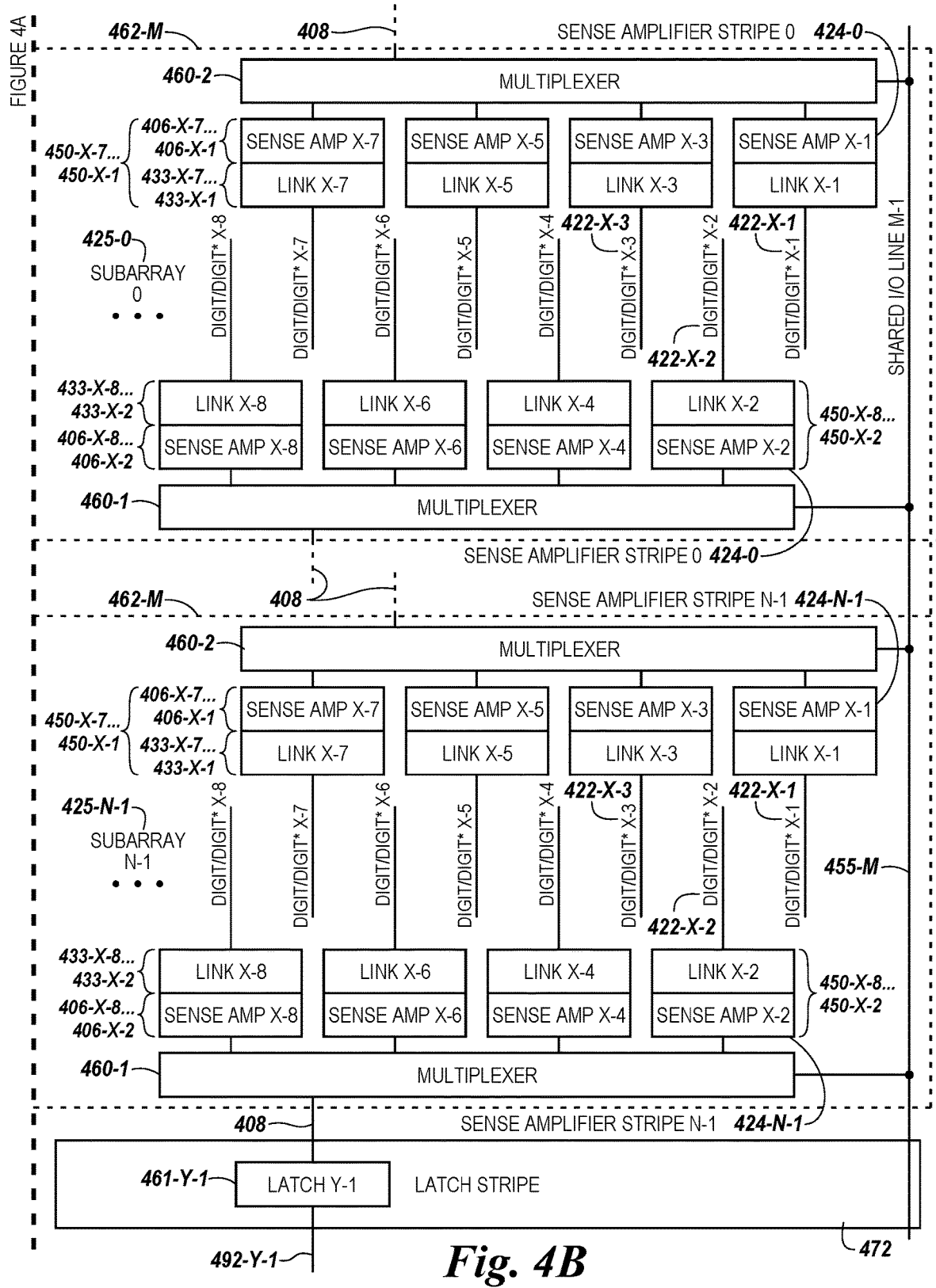

As used herein, the additional latches are intended to mean additional functionalities (e.g., peripheral amplifiers) that sense (e.g., read, store, cache) data values of memory cells in an array and that are distinct from the sense amplifiers described herein. As such, the additional latches can be included in a "latch component 170". For example, latches 461, as shown in FIGS. 4A and 4B, of the latch component 170 can be located on a periphery of a bank 123 of the memory device, whereas the sense amplifiers can be located in a plurality of sense amplifier stripes 124 that are physically associated with each subarray 125 of memory cells in the bank 123, as shown in FIG. 1B. The latch component 170 also can include a latch stripe 472, latch component links 433, and/or associated link lines 408, as shown in FIGS. 4A and 4B.

Figure 1C:
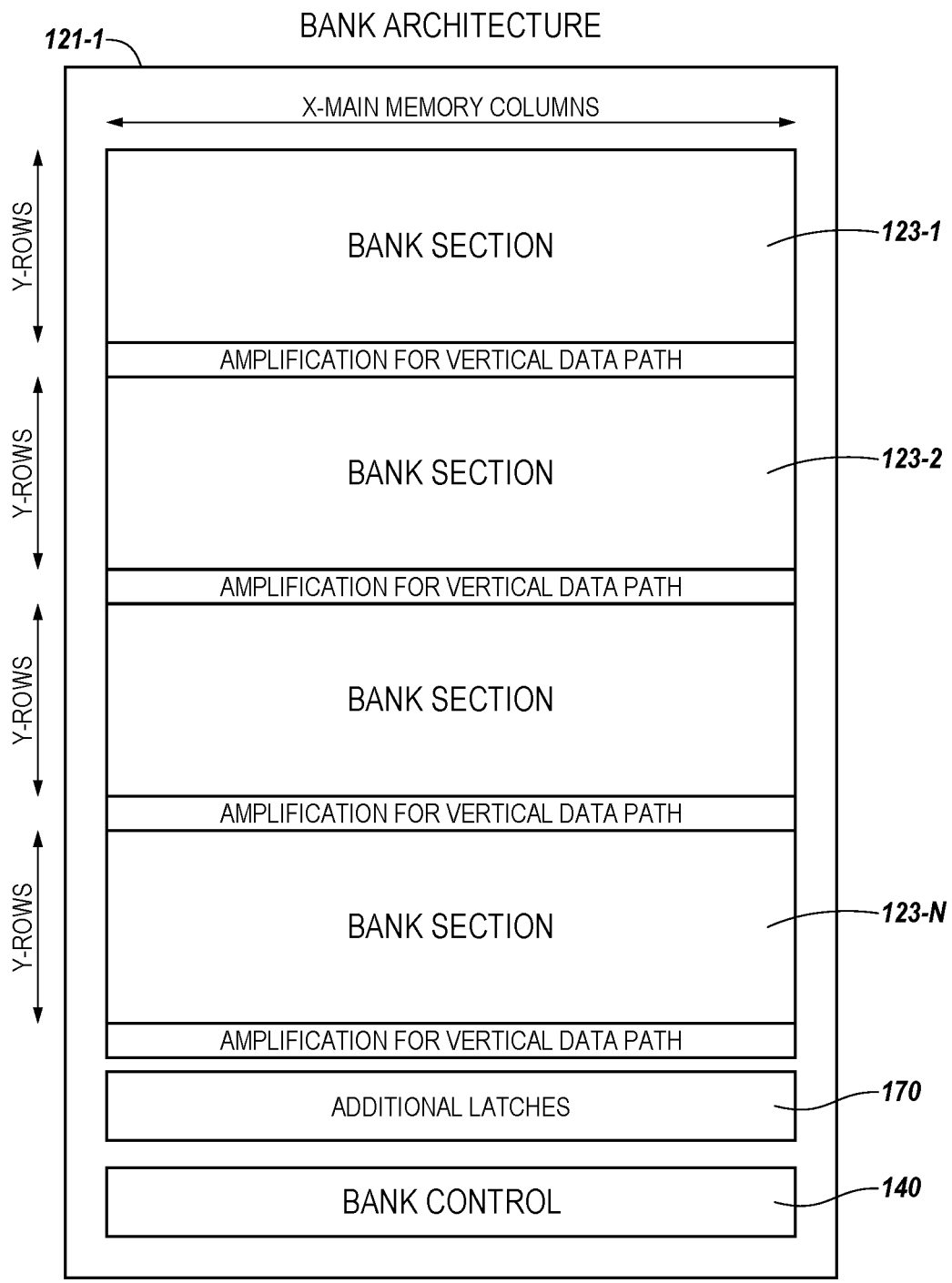
FIG. 1C is a block diagram of a bank to a memory device in accordance with a number of embodiments of the present disclosure.

System 100 in FIG. 1A includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the examples shown in FIGS. 1A-1C illustrate a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a data bus 156 (e.g., an I/O bus) through I/O circuitry 144. Status, exception, and other data information can be provided from the controller 140 on the memory device 120 to a channel controller 143 via an HSI 141, including an out-of-band (OOB) bus 157, which in turn can be provided from the memory device 120 to the host 110. Address signals are received through address circuitry 142 and decoded by a row decoder 146 and a column decoder 152 to access the memory array 130. Data can be read from memory array 130 by sensing voltage and/or current changes on the sense lines using sensing circuitry 150. The I/O circuitry 144 can be used for bi-directional data communication with host 110 over the data bus 156.

Controller 140 (e.g., bank control logic and/or sequencer) decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller. The controller 140 can control shifting data (e.g., right or left) in an array (e.g., memory array 130).

Examples of the sensing circuitry 150 are described further below. For instance, in a number of embodiments, the sensing circuitry 150 can include a number of sense amplifiers (e.g., 206 in FIG. 2 and corresponding reference numbers in FIGS. 3, 4A, and 4B), and a number of latch components 170, as described herein. The sense amplifiers and the latch components 170 each may serve as, and be referred to herein as, accumulators and each can be used to perform separate logical operations (e.g., on data associated with complementary digit lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on memory device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. The latch component 170 can include latches, as described herein, and can be coupled to, and form a part of, the sensing circuitry 150.

For example, the sensing circuitry 150 described herein can be formed on a same pitch as a pair of complementary sense lines. As an example, a pair of complementary memory cells may have a cell size with a $6F^2$ pitch (e.g., 3F×2F). If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines.

Furthermore, the circuitry of the processing resource(s) (e.g., a compute engine, such as an ALU) of various prior systems may not conform to pitch rules associated with a memory array. For example, the memory cells of a memory array may have a $4F^2$ or $6F^2$ cell size. As such, the devices (e.g., logic gates) associated with ALU circuitry of previous systems may not be capable of being formed on pitch with the memory cells (e.g., on a same pitch as the sense lines), which can affect chip size and/or memory density, for example. In the context of some computing systems and subsystems (e.g., a central processing unit (CPU)), data may be processed in a location that is not on pitch and/or on chip with memory (e.g., memory cells in the array), as described herein. As used herein, "on chip" is intended to mean formed on a same chip as an array of memory cells and/or the sensing circuitry selectably coupled to the memory cells. The data may be processed by a processing resource associated with a host, for instance, rather than on pitch with the memory.

In contrast, a number of embodiments of the present disclosure can include the sensing circuitry 150 (e.g., including sense amplifiers 206 and/or compute components 231) being formed on pitch with the memory cells of the array. The sensing circuitry can be configured for (e.g., capable of) performing compute functions (e.g., logical operations).

PIM capable device operations can use bit vector based operations. As used herein, the term "bit vector" is intended to mean a physically contiguous number of bits on a bit vector memory device (e.g., a PIM device) stored physically contiguous in a row of an array of memory cells. Thus, as used herein a "bit vector operation" is intended to mean an operation that is performed on a bit vector that is a contiguous portion of virtual address space (e.g., used by a PIM device). For example, a row of virtual address space in the PIM device may have a bit length of 16K bits (e.g., corresponding to 16K complementary pairs of memory cells in a DRAM configuration). Sensing circuitry 150, as described herein, for such a 16K bit row may include a corresponding 16K processing elements (e.g., compute components, as described herein) formed on pitch with the sense lines selectably coupled to corresponding memory cells in the 16 bit row. A compute component in the PIM device may operate as a one bit processing element on a single bit of the bit vector of the row of memory cells sensed by the sensing circuitry 150 (e.g., sensed by and/or stored in a sense amplifier paired with the compute component, as described herein).

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to complement and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

FIG. 1A can represent an apparatus architecture in the form of a computing system 100 including a memory device 120 having a plurality of banks (e.g., 121-1, ..., 121-N) coupled to the host 110 via the channel controller 143. In at least one embodiment, the channel controller 143 may be coupled to and integrated with the plurality of banks of the memory device 120 and/or the channel controller 143 may be coupled to and integrated with the host 110. The channel controller 143 can be coupled to each of the plurality of banks of the memory device via an address and control (A/C) bus 154, which in turn can be coupled to the host 110. The channel controller 143 can also be coupled to each of the plurality of banks via a data bus 156, which in turn can be coupled to the host 110. In addition, the channel controller 143 can be coupled to each of the plurality of banks via an OOB bus 157 associated with the HSI 141, also referred to herein as a status channel interface, which is configured to report status, exception and other data information to the channel controller 143 to exchange with the host 110.

As shown in FIG. 1A, the channel controller 143 can receive the status and exception information from the HSI 141 associated with a bank arbiter 145 associated with each of the plurality of banks. The bank arbiter 145 can sequence control and data with the plurality of banks (e.g., Bank zero (0), Bank one (1), ..., Bank six (6), Bank seven (7), etc.). A controller 140 can be associated with each particular bank, Bank 0, ..., Bank 7, in a given memory device 120 and can decode signals provided by control bus 154 from the host 110. Each of the plurality of banks, Bank 0, ..., Bank 7, can include the controller 140 and other components, including an array of memory cells 130 and sensing circuitry 150, latch component 170, and/or transfer components 171 (as described in detail in connection with FIG. 5), etc.

That is, each of the plurality of banks (e.g., in a plurality of memory devices each having a plurality of banks) can include address circuitry 142 to latch address signals provided over a data bus 156 (e.g., an I/O bus) through I/O circuitry 144. Status and/or exception information can be provided from the controller 140 associated with (e.g., on chip with) each bank to the channel controller 143, using the OOB bus 157, which in turn can be provided from the plurality of banks to the host 110. For each of the plurality of banks (e.g., Bank 0, ..., Bank 7) address signals can be received through address circuitry 142 and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130 and the OOB bus 157 can be used to report status and exception information to the channel controller 143.

In some embodiments, the channel controller 143 can dispatch commands to the plurality of banks (e.g., Bank 0, ..., Bank 7) and field return results/data from such operations. As described herein, the return results/data can be returned to the channel controller 143 via the OOB bus 157 associated with the status channel interface on each of the plurality of banks (e.g., Bank 0, ..., Bank 7).

FIG. 1B is a block diagram of a bank section 123 to a memory device in accordance with a number of embodiments of the present disclosure. That is, bank section 123 can represent an example section of a number of bank sections to a bank of a memory device (e.g., bank section 0, bank section 1, ..., bank section M). As shown in FIG. 1B, a bank architecture can include a plurality of memory columns 122 shown horizontally as X (e.g., 16,384 columns in an example DRAM bank and bank section). Additionally, the bank section 123 may be divided into subarray 0, subarray 1, . . . , and subarray N−1 (e.g., 128 subarrays) shown at 125-0, 125-1, . . . , 125-N−1, respectively, that are separated by amplification regions configured to be coupled to a data path. As such, the subarrays 125-0, 125-1, . . . , 125-N−1 can each have amplification regions 124-0, 124-1, . . . , 124-N−1 that correspond to sense amplifier stripe 0, sense amplifier stripe 1, . . . , and sense amplifier stripe N−1, respectively.

Each column 122 is configured to be coupled to sensing circuitry 150, as described in connection with FIG. 1A and elsewhere herein. As such, each column in a subarray can be coupled individually to a sense amplifier that contributes to a sense amplifier stripe for that subarray. That is, as shown in FIG. 1B, the bank architecture can include sense amplifier stripe 0, sense amplifier stripe 1, . . . , sense amplifier stripe N−1 that each have sensing circuitry 150 with sense amplifiers that can, in various embodiments, be used as registers, cache and data buffering and that are coupled to each column 122 in the subarrays 125-0, 125-1, . . . , 125-N−1.

Each of the of the subarrays 125-0, 125-1, . . . , 125-N−1 can include a plurality of rows 119 shown vertically as Y (e.g., each subarray may include 512 rows in an example DRAM bank). Example embodiments are not limited to the example horizontal and vertical orientation of columns and rows described herein or the example numbers thereof.

The latch component 170 within the sensing circuitry 150 coupled to the memory array 130, as shown in FIG. 1A, can complement and can be connected (e.g., selectably coupled) to the transfer components 171 associated with the controller 140. The sense amplifiers are located in a plurality of sense amplifier stripes 124 that are each physically associated with a subarray 125 of memory cells in the bank section 123 shown in FIG. 1B. In contrast, the latch component 170 configured to retrieve data (e.g., a register value) from the bank section 123 includes a plurality of latches located in a single latch stripe 172 on a periphery of the bank section 123. The plurality of latches can each be configured with a store (cache) for retrieved data values (e.g., data values retrieved from a row 119 including the retrieved register value). Each column 122 is configured to be coupled to latches in the latch stripe 172 (e.g., via the same or different sense lines used for coupling the sense amplifiers). As such, each column in the bank can be selectably coupled to a latch that contributes to the latch stripe 172 for that bank. Each bank 121-0, . . . , 121-7 of the memory array 130 can be configured to include its own latch stripe 172.

As shown in FIG. 1B, the bank architecture can be associated with controller 140. The controller 140 shown in FIG. 1B can, in various examples, represent at least a portion of the functionality embodied by and contained in the controller 140 shown in FIG. 1A. The controller 140 can direct (e.g., control) input of commands and data 141 to the bank architecture and output of data from the bank architecture (e.g., to the host 110) along with control of data transfer in the bank architecture, as described herein. The bank architecture can include a data bus 156 (e.g., a 64 bit wide data bus) to DRAM DQs, which can correspond to the data bus 156 described in connection with FIG. 1A.

FIG. 1C is a block diagram of a bank 121-1 to a memory device in accordance with a number of embodiments of the present disclosure. That is, bank 121-1 can represent an example bank to a memory device 120, such as Bank 0, . . . , Bank 7 (121-0, . . . , 121-7) described in connection with FIG. 1A. As shown in FIG. 1C, a bank architecture can include a plurality of main memory columns (shown horizontally as X) (e.g., 16,384 columns in an example DRAM bank). Additionally, the bank 121-1 may be divided up into sections (e.g., subarrays), 123-1, 123-2, . . . , 123-N, separated by amplification regions for a data path (e.g., amplification regions 124-0, 124-1, . . . , 124-N−1 that correspond to sense amplifier stripe 0, sense amplifier stripe 1, . . . , and sense amplifier stripe N−1 in FIG. 1B). Each of the of the bank sections 123-1, . . . , 123-N can include a plurality of rows (shown vertically as Y) (e.g., each section may include 512 rows in an example DRAM bank). Example embodiments are not limited to the example horizontal and/or vertical orientation of columns and rows described here or the example numbers thereof.

As shown in FIG. 1C, the bank architecture can include a latch component 170, including latches each with a cache, that is coupled to the bank sections 123-1, . . . , 123-N. The latch component 170 can represent another example of the latch component 170 of the sensing circuitry 150 coupled to the memory array 130 (e.g., a bank thereof) and the controller 140 shown in FIG. 1A and/or the latch stripe 172 associated with the subarrays 125-0, 125-1, . . . , 125-N−1 and the controller 140 shown in FIG. 1B. Further, as shown in FIG. 1C, the bank architecture can be associated with bank control (e.g., controller 140). The bank control shown in FIG. 1C can, for example, represent at least a portion of the functionality embodied by and contained in the controller 140 shown in FIGS. 1A and 1B.

Figure 2:
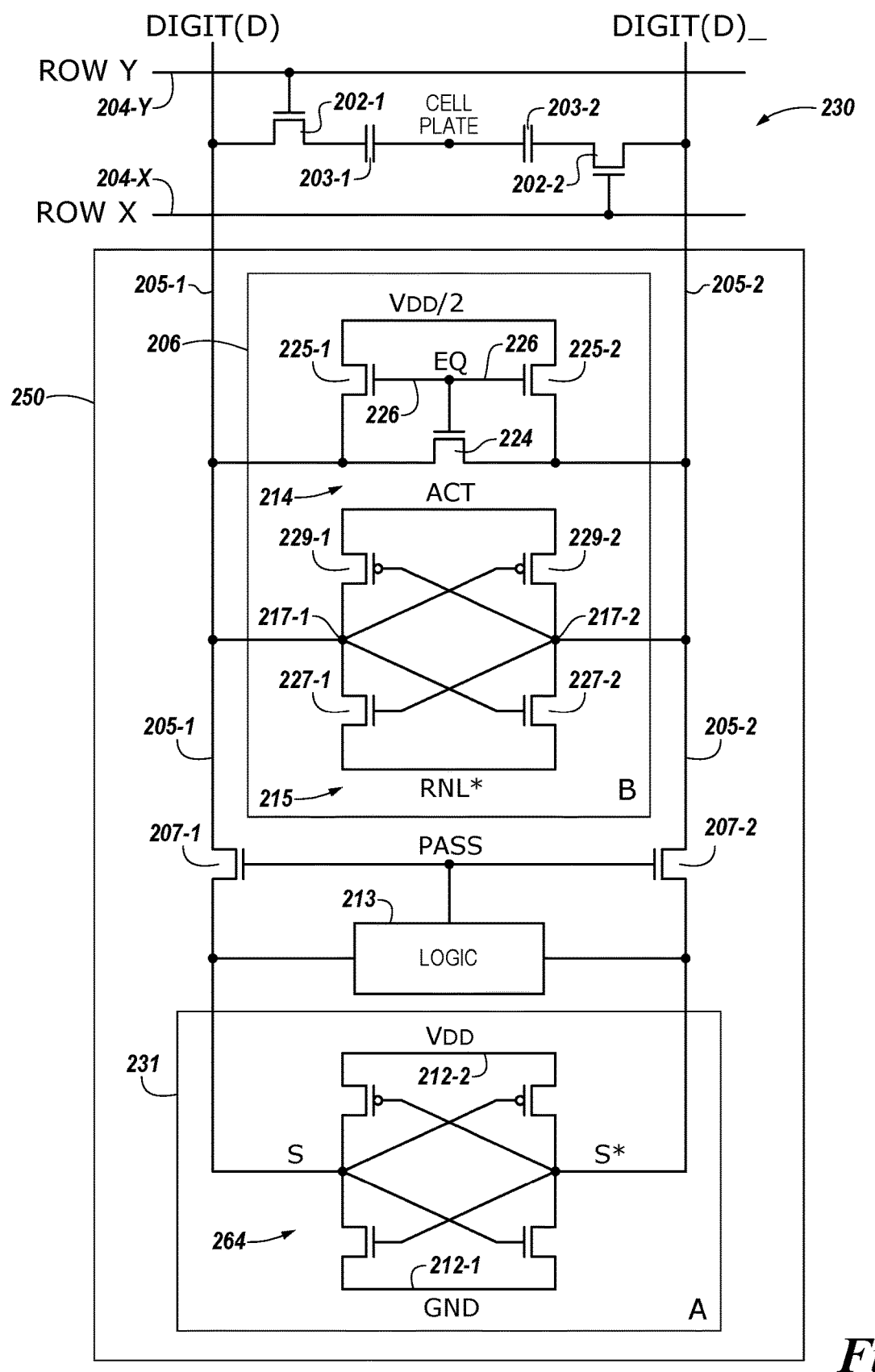
FIG. 2 is a schematic diagram illustrating sensing circuitry to a memory device in accordance with a number of embodiments of the present disclosure.

FIG. 2 is a schematic diagram illustrating sensing circuitry 250 in accordance with a number of embodiments of the present disclosure. The sensing circuitry 250 can correspond to sensing circuitry 150/170 shown in FIG. 1A.

A memory cell can include a storage element (e.g., capacitor) and an access device (e.g., transistor). For instance, a first memory cell can include transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

Figure 3:
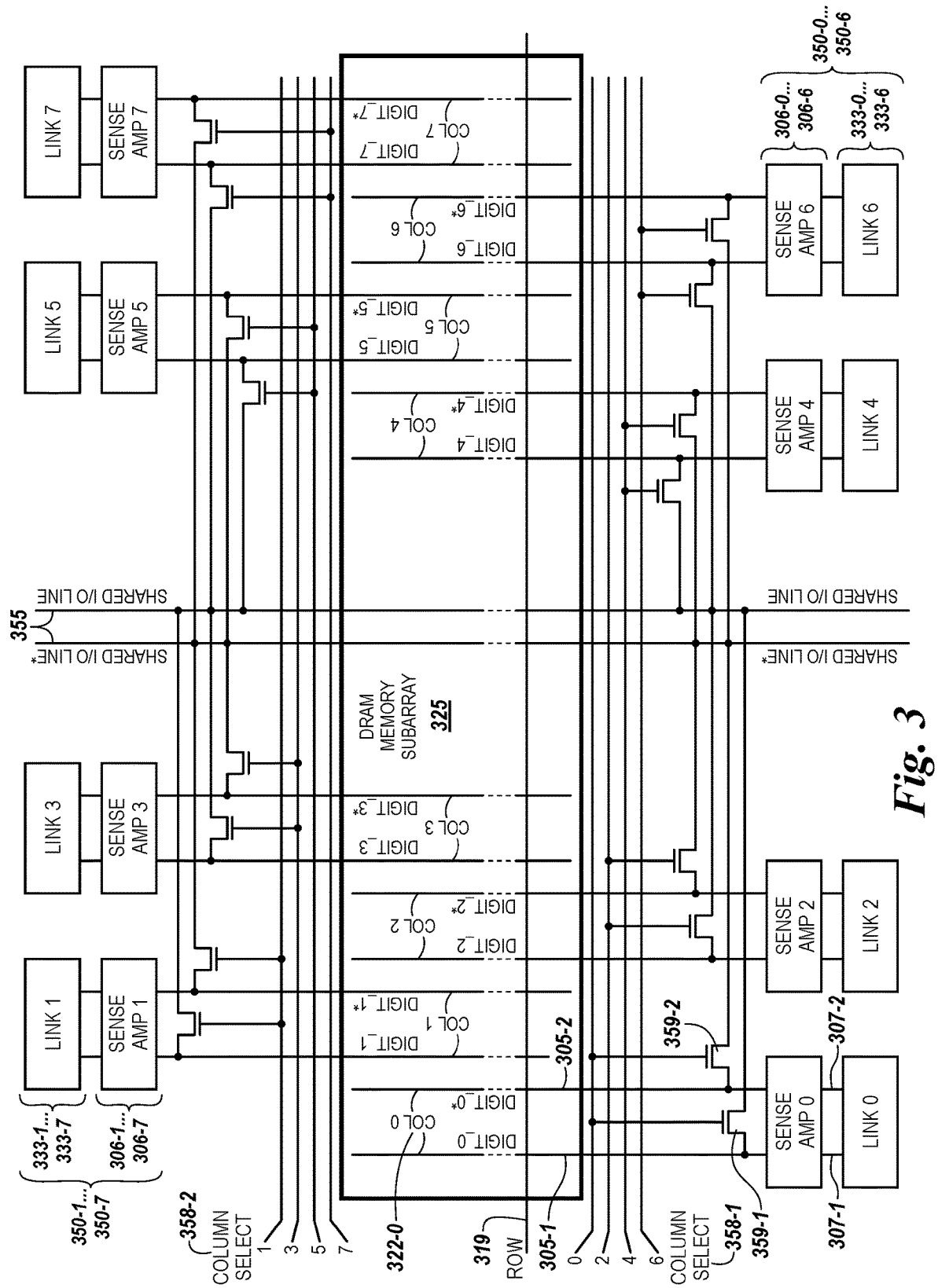
FIG. 3 is a schematic diagram illustrating circuitry for data transfer in a memory device in accordance with a number of embodiments of the present disclosure.

The cells of the memory array 230 can be arranged in rows coupled by access (word) lines 204-X (Row X), 204-Y (Row Y), etc., and columns coupled by pairs of complementary sense lines (e.g., digit lines DIGIT(D) and DIGIT (D)_shown in FIG. 2 and DIGIT_0 and DIGIT_0* shown in FIGS. 3, 4A, and 4B). The individual sense lines corresponding to each pair of complementary sense lines can also be referred to as digit lines 205-1 for DIGIT (D) and 205-2 for DIGIT (D)_, respectively, or corresponding reference numbers in FIGS. 3, 4A, and 4B. Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The memory array 230 is configured to couple to sensing circuitry 250 in accordance with a number of embodiments of the present disclosure. In this embodiment, the sensing circuitry 250 includes a sense amplifier 206 and a compute component 231 corresponding to respective columns of memory cells (e.g., coupled to respective pairs of complementary digit lines). The sense amplifier 206 can be coupled to the pair of complementary digit lines 205-1 and 205-2. The compute component 231 can, in some embodiments, be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The logical operation selection logic 213 can also be coupled to the pair of complementary digit lines 205-1 and 205-2. The logical operation selection logic 213 can be configured to control continuity of pass gates 207-1 and 207-2 based on a selected logical operation.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary digit lines D 205-1 and (D)_205-2. However, embodiments are not limited to this example. The latch 215 can be a cross coupled latch (e.g., gates of a pair of transistors) such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the digit lines 205-1 (D) or 205-2 (D)_ will be slightly greater than the voltage on the other one of digit lines 205-1 (D) or 205-2 (D)_. An ACT signal and an RNL* signal can be driven low to enable (e.g., fire) the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage $V_{CC}$ through a source transistor, and the other digit line 205-1 (D) or 205-2 (D)_ is driven to the voltage of the reference voltage (e.g., ground) through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell. As used herein, the cross coupled latch of sense amplifier 206 may be referred to as a primary latch 215.

Embodiments are not limited to the sense amplifier 206 configuration illustrated in FIG. 2. As an example, the sense amplifier 206 can be a current-mode sense amplifier and a single-ended sense amplifier (e.g., sense amplifier coupled to one digit line). Also, embodiments of the present disclosure are not limited to a folded digit line architecture such as that shown in FIG. 2.

The sense amplifier 206 and the compute component 231 can, individually or in conjunction with each other, be operated to perform various logical operations using data from an array as input. In a number of embodiments, the result of a logical operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across local and global I/O lines in order to perform compute functions (e.g., between memory and discrete processor), a number of embodiments can enable an increased (e.g., faster) processing capability as compared to previous approaches.

The sense amplifier 206 and/or the compute component 231 can further include equilibration circuitry 214, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ enables the transistors 224, 225-1, and 225-2, which effectively shorts digit lines 205-1 (D) and 205-2 (D)_ together and to the equilibration voltage (e.g., $V_{CC}/2$).

Although FIG. 2 shows sense amplifier 206 comprising the equilibration circuitry 214, embodiments are not so limited, and the equilibration circuitry 214 may be implemented discretely from the sense amplifier 206 (e.g., in the compute component 231), implemented in a different configuration than that shown in FIG. 2, or not implemented at all.

In a number of embodiments, the sensing circuitry 250 (e.g., sense amplifier 206 and compute component 231) can be operated to perform a selected logical operation and initially store the result in the sense amplifier 206 and/or a latch (not shown) coupled to the compute component 231 without transferring data from the sensing circuitry via a local or global I/O line (e.g., without performing a sense line address access via activation of a column decode signal, for instance).

Performance of logical operations (e.g., Boolean logical functions involving data values) is fundamental and commonly used. Boolean logic functions are used in many higher level functions. Consequently, speed and power efficiencies that can be realized with improved logical operations, can translate into speed and power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215. In some embodiments, a pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 231 is not limited to that shown in FIG. 2, and various other embodiments are feasible.

FIG. 3 is a schematic diagram illustrating circuitry for data transfer in a memory device in accordance with a number of embodiments of the present disclosure. FIG. 3 shows eight sense amplifiers (e.g., sense amplifiers 0, 1, . . . , 7 shown at 306-0, 306-1, . . . , 306-7, respectively) each coupled to a pair of complementary sense lines (e.g., digit lines 305-1 and 305-2). FIG. 3 also shows eight latch component links (e.g., latch component links 0, 1, . . . , 7 shown at 333-0, 333-1, . . . , 333-7). In some embodiments, each latch component link can be coupled to a sense amplifier (e.g., as shown for sense amplifier 0 306-0 via pass gates and digit lines 307-1 and 307-2), where the pass gates can be connected as shown in FIG. 2 and can be controlled by a logical operation selection signal, Pass. For example, an output of the selection logic can be coupled to the gates of the pass gates and digit lines 307-1 and 307-2. Corresponding pairs of the sense amplifiers and latch component links can contribute to formation of the sensing circuitry indicated at 350-0, 350-1, . . . , 350-7.

Data values present on the pair of complementary digit lines 305-1 and 305-2 can be loaded into the latch component link 333-0 as described in connection with FIG. 2. That is, when the pass gates are open, data values on the pair of complementary digit lines 305-1 and 305-2 can be passed from the sense amplifiers to the latch component link (e.g., 306-0 to 333-0). The data values on the pair of complementary digit lines 305-1 and 305-2 can be the data value stored in the sense amplifier 306-0 when the sense amplifier is fired and/or sent via the latch component link 333-0 through a selectably coupled shared I/O line 355 to be stored in a latch (e.g., latch 0 at 461-0 in FIG. 4A or latch Y−1 at 461-Y−1 in FIG. 4B) when the latch is fired. Alternatively or in addition, each latch component link 333 can be selectably coupled, as described herein, to respective columns of memory cells by being directly coupled to the respective pairs of complementary digit lines (e.g., without being coupled via pass gates of an intervening sense amplifier).

The sense amplifiers 306-0, 306-1, . . . , 306-7 in FIG. 3 can each correspond to sense amplifier 206 shown in FIG. 2. A combination of one sense amplifier with one latch through the latch component links 333-0, 333-1, . . . , 333-7 shown in FIG. 3 can contribute to the sensing circuitry (e.g., 350-0, 350-1, . . . , 350-7) of a portion of a DRAM memory subarray 325. The sense amplifiers 306-0, 306-1, . . . , 306-7 can be included in a sense amplifier stripe, as shown at 124 in FIG. 1B and at corresponding reference numbers in FIGS. 4A and 4B. The latch component links 333-0, 333-1, . . . , 333-7, shown in FIG. 3, can be configured to couple to a shared I/O line 355, as described herein, to send sensed data values from a row, including a register value, to latches in a latch stripe, as shown at 172 in FIG. 1B and at corresponding reference numbers in FIGS. 4A and 4B.

The configurations of embodiments illustrated in FIG. 3 are shown for purposes of clarity and are not limited to these configurations. For instance, the configuration illustrated in FIG. 3 for the sense amplifiers 306-0, 306-1, . . . , 306-7 in combination with the latch component links 333-0, 333-1, . . . , 333-7 and the shared I/O line 355 is not limited to half the combination of the sense amplifiers 306-0, 306-1, . . . , 306-7 and the latch component links 333-0, 333-1, . . . , 333-7 of the sensing circuitry being formed above the columns 322 of memory cells (not shown) and half being formed below the columns 322 of memory cells. Nor are the numbers of such sense amplifiers and latch component links forming the sensing circuitry configured to couple to a shared I/O line each limited to being the same number (e.g., eight). In addition, the configuration of the shared I/O line 355 is not limited to being split into two for separately coupling each of the two sets of complementary digit lines 305-1 and 305-2, nor is the positioning of the shared I/O line 355 limited to being in the middle of the combination of the sense amplifiers and the latch component links forming the sensing circuitry (e.g., rather than being at either end of the combination of the sense amplifiers and the latch component links).

Moreover, the sense amplifiers and the latch component links are not limited to being connected (coupled) to each other. That is, in various embodiments, the sense amplifiers and the latch component links can each be independently coupled to the same sense lines (e.g., digit lines 305-1 and 305-2) or the sense amplifiers and the latch component links can each be independently coupled to the particular columns 322 of the subarray 325 through their own separate sense lines.

Figure 5:
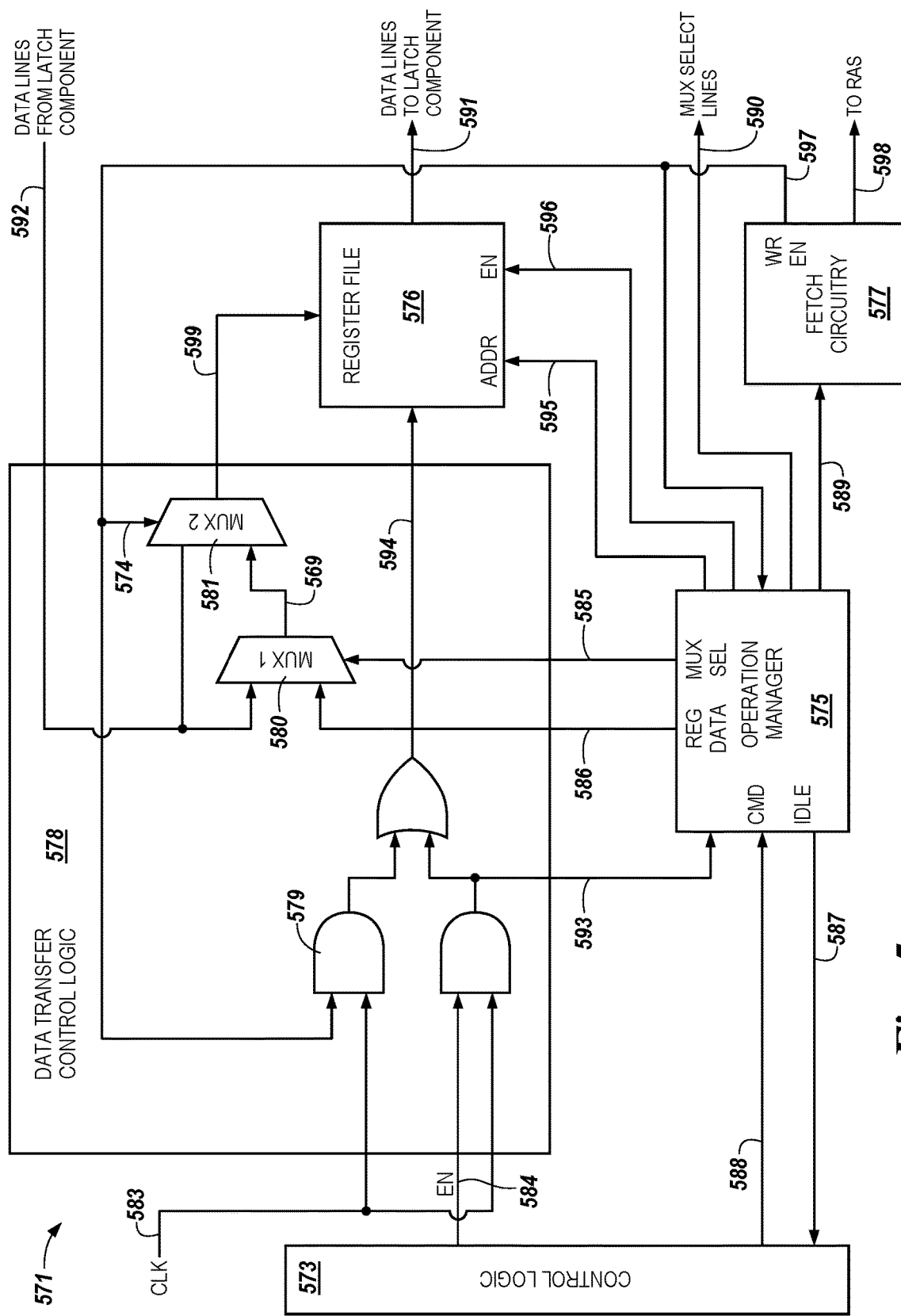
FIG. 5 is another schematic diagram illustrating circuitry for data transfer in a memory device in accordance with a number of embodiments of the present disclosure.

The circuitry illustrated in FIG. 3 also shows column select circuitry 358-1, 358-2 that is configured to implement data transfer operations on particular columns 322 of a subarray 325 and the complementary digit lines 305-1 and 305-2 thereof (e.g., as directed by the controller 140 shown in FIGS. 1A-1C and/or fetch circuitry 577 and/or data transfer control logic 578 of the controller shown in FIG. 5). Data transfer operations can include coupling sensed data values from a row, including the register value, to the shared I/O line 355. For example, column select circuitry 358-1 has select lines 0, 2, 4, and 6 that are configured to couple with corresponding columns, such as column 0 (332-0), column 2, column 4, and column 6. Column select circuitry 358-2 has select lines 1, 3, 5, and 7 that are configured to couple with corresponding columns, such as column 1, column 3, column 5, and column 7.

The controller 140 (e.g., fetch circuitry 577 and/or data transfer control logic 578 of the controller) can be coupled to column select circuitry 358 to control select lines (e.g., select line 1) to access data values stored in the latches, data values to be sent via the latch component links, and/or present on the pair of complementary digit lines (e.g., 305-1 and 305-2 when selection transistors 359-1, 359-2 are enabled via signals from column select line 0). Enabling the selection transistors 359-1, 359-2 (e.g., as directed by the controller 140 and/or the fetch circuitry 577 and/or data transfer control logic 578) enables coupling of sense amplifier 0 306-0 and/or latch component link 0 333-0 to couple with complementary digit lines 305-1 and 305-2 of column 0 (322-0) to transfer data values on digit line 0 and digit line 0\* for a particular row 319. Data values from rows in each of columns 0 through 7 can similarly be selected by controller 140 and/or fetch circuitry 577 and/or data transfer control logic 578 coupling, via an appropriate select line, a particular combination of latch component links with paired complementary digit lines by enabling the appropriate selection transistors.

Moreover, enabling the selection transistors (e.g., selection transistors 359-1, 359-2) enables a particular latch component link (e.g., 333-0) to be coupled with a shared I/O line 355 such that the sensed data values can be placed on (e.g., transferred to) the shared I/O line 355. In some embodiments, one column at a time is selected (e.g., column 0 322-0) to be coupled to a particular shared I/O line 355 to transfer the sensed data values. In the example configuration of FIG. 3, the shared I/O line 355 is illustrated as a shared, differential I/O line pair (e.g., shared I/O line and shared I/O line\*). Hence, selection of column 0 322-0 could yield two data values (e.g., two bits with values of 0 and/or 1) from each memory cell of a row (e.g., 319) for the latch component links associated with complementary digit lines 305-1 and 305-2. These data values could be input in parallel to each of the shared, differential I/O pair, shared I/O and shared I/O\*, of the shared differential I/O line 355.

FIGS. 4A and 4B are another schematic diagram illustrating circuitry for data transfer in a memory device in accordance with a number of embodiments of the present disclosure. As illustrated in FIGS. 1B and 1C and shown in more detail in FIGS. 4A and 4B, a bank section of a DRAM memory device can include a plurality of subarrays, which are indicated in FIGS. 4A and 4B at 425-0 as subarray 0 and at 425-N-1 as subarray N-1.

FIGS. 4A and 4B, which are to be considered as horizontally connected, illustrate that each subarray (e.g., subarray 0 425-0 partly shown in FIG. 4A and partly shown in FIG. 4B) can have a number of associated sense amplifiers 406-0, 406-1, . . . , 406-X-1 and latch component links 433-0, 433-1, . . . , 433-X-1. Each subarray, 425-0, . . . , 425-N-1, also can have one or more associated sense amplifier stripes (e.g., 424-0, . . . , 424-N-1) that include the sense amplifiers 406-0, 406-1, . . . , 406-X-1. According to embodiments described herein, each subarray, 425-0, . . . , 425-N-1, can be split into portions 462-1 (shown in FIG. 4A), 462-2, . . . , 462-M (shown in FIG. 4B). The portions 462-1, . . . , 462-M may be defined by configuring a predetermined number of the sense amplifiers and latch component links (e.g., sensing circuitry 150), along with the corresponding columns (e.g., 422-0, 422-1, . . . , 422-7) among columns 422-0, . . . , 422-X-1 to a given shared I/O line (e.g., 455) and/or a given data line (e.g., 492). In at least one embodiment, a shared I/O line 455-M used by the sense amplifiers may be different from a corresponding data line 492-Y-1 used by a latch 461-Y-1 in the latch stripe 472.

In some embodiments, as shown in FIGS. 3, 4A, and 4B, the predetermined number of the sense amplifiers and/or latch component links, along with the corresponding columns, configured per shared I/O line, can be eight. The number of portions 462-1, 462-2, . . . , 462-M of the subarray can be the same as the number of shared I/O lines 455-1, 455, 2, . . . , 455-M for the sense amplifiers and/or latch component links configured to couple to the subarray. The subarrays can be arranged according to various DRAM architectures for coupling shared I/O lines 455-1, 455, 2, . . . , 455-M between subarrays 425-0, 425-1, . . . , 425-N-1.

For example, portion 462-1 of subarray 0 425-0 in FIG. 4A can correspond to the portion of the subarray of the bank illustrated in FIG. 3. As such, sense amplifier 0 406-0 and latch component link 0 433-0 can be coupled to column 422-0. As described herein, a column can be configured to include a pair of complementary digit lines (sense lines) referred to as digit line 0 and digit line 0\*. However, alternative embodiments can include a single digit line 405-0 (sense line) for a single column of memory cells. Embodiments are not so limited.

As illustrated in FIGS. 1B and 1C and shown in more detail in FIGS. 4A and 4B, a sense amplifier stripe can, in various embodiments, extend from one end of a subarray to an opposite end of each subarray in the bank. For example, as shown for subarray 0 (425-0), sense amplifier stripe 0 (424-0, shown schematically above and below DRAM columns in a folded sense line architecture) can include and extend from sense amplifier 0 (406-0) in portion 462-1 to sense amplifier X-1 (406-X-1) in portion 462-M of subarray 0 (425-0).

As described in connection with FIG. 3, the configuration illustrated in FIGS. 4A and 4B for the sense amplifiers 406-0, 406-1, . . . , 406-X-1, the latch component links 433-0, 433-1, . . . , 433-X-1, and shared I/O line 0 (455-1) through shared I/O line M-1 (455-M) is not limited to half of the sense amplifiers and/or latch component links of the sensing circuitry (e.g., 450) being formed above the columns of memory cells and half being formed below the columns of memory cells 422-0, 422-1, . . . , 422-X-1 in a folded DRAM architecture. That is, in various embodiments, a sense amplifier stripe 424 for a particular subarray 425 can be formed with any number of the sense amplifiers of the sensing amplifier stripe and/or the latch component links being formed above and below the columns of memory cells. Accordingly, in some embodiments as illustrated in FIGS. 1B and 1C, all of the sense amplifiers of the sensing circuitry and corresponding sensing amplifier stripes can be formed above or below the columns of memory cells of each subarray in the bank.

In contrast, the number of latch component links 433-0, 433-1, . . . , 433-X-1 for each portion 462-1, 462-2, . . . , 462-M of each subarray 425-0, 425-1, . . . , 425-N-1 of the bank can be selectively coupled through a number of link lines 408 and/or through the shared I/O lines 455-1, . . . , 455-M to a latch stripe 472. The number of latches 461-0, 461-1, . . . , 461-Y-1 in the latch stripe 472 can correspond to the number of latch component links 433-0, 433-1, . . . , 433-X-1 and/or the number of link lines 408 for each portion 462-1, 462-2, . . . , 462-M of each subarray 425-0, 425-1, . . . , 425-N-1 of the bank. That is, the link line 408 coming from the top of multiplexers 460-2 of subarrays 425-0 and 425-N-1, respectively, are intended to lead to a corresponding latch 461-0, 461-1, . . . , 461-Y-1 in latch stripe 472 and the link line 408 coming from the bottom of multiplexers 460-1 of subarrays 425-0 and 425-N-1, respectively, are intended to lead to the same corresponding illustrated latch 461-0, 461-1, . . . , 461-Y-1 in the latch stripe 472. For example, each portion 462-1, 462-2, . . . , 462-M of each subarray 425-0, 425-1, . . . , 425-N-1 of the bank, in some embodiments, may be coupled through link lines 408 to a single latch per portion in the latch stripe 472. However, embodiments are not limited to one latch per portion of each subarray. For example, there may be up to one latch per latch component link 433-0, 433-1, . . . , 433-X-1. In some embodiments, there can be a single latch stripe 472 for the subarrays 425-0, 425-1, . . . , 425-N-1 of the bank.

The latch component links 433-0, 433-1, . . . , 433-X-1 for each subarray 425-0, 425-1, . . . , 425-N-1 of the bank can be selectively coupled via a number of multiplexers 460-1, 460-2 in each subarray, which can include column select circuitry (e.g., 358) and/or selection transistors (e.g., 359-1, 359-2) as described in connection with FIG. 3. As such, data retrieval operations can be implemented on particular columns 422 of each subarray, and the complementary digit lines thereof, that couple stored data values in a row via the latch component links 433 to corresponding latches 461-0, 461-1, . . . , 461-Y-1 in the latch stripe 472. For example, a data retrieval operation can be implemented on column 422-0 of subarray 425-0, and the complementary digit lines thereof, that couples stored data values in row 319 via the latch component link 433-0 to corresponding latch 461-0 in the latch stripe 472.

Hence, the controller 140 can direct that data values, including the intended register value, of memory cells in a particular row (e.g., row 319) of subarray 0 (425-0) be sensed and retrieved to the latches 461-0, 461-1, . . . , 461-Y-1 of the latch stripe 472. The retrieval of the data values, including the intended register value, of the particular row to the latch stripe 472 can be performed as part of an operation to transfer the register value to a register file (e.g., 576 as shown in FIG. 5) of the transfer components 171 (e.g., as shown in FIG. 1 and described in detail in connection with FIG. 5).

The column select circuitry (e.g., 358) and/or selection transistors (e.g., 359-1, 359-2, shown in FIG. 3) can be included in the one or more multiplexers 460-1, 460-2 shown in FIGS. 4A and 4B. The multiplexers can direct retrieval (e.g., sequential retrieval) of data values from each of the eight columns (e.g., digit/digit*) in the portion (e.g., 462-1) of the subarray (e.g., 425-0) for a particular row such that the latches 461-0, 461-1, . . . , 461-Y-1 of the latch stripe 472 can store (cache) the data values. The latches 461-0, 461-1, . . . , 461-Y-1 can be coupled (e.g., via multiplexers 460-1, 460-2 shown in FIGS. 4A and 4B and/or multiplexers 580 and 581 (Mux 1 and Mux 2, respectively) shown in FIG. 5) to a respective data line per latch (e.g., data lines 492-0, 492-1, . . . , 492-Y-1 corresponding to data lines 592 shown in FIG. 5) in a particular order (e.g., in an order in which the columns were sense), or in parallel as part of the operation to transfer the register value to a register file (e.g., 576). Alternatively or in combination, with complementary digit lines, digit/digit*, and complementary shared I/O lines 455-1, 455, 2, . . . , 455-M for each portion of eight columns, there can be 16 data values (e.g., bits) sequenced to the shared I/O line from one portion of the subarray such that one data value (e.g., bit) is input to each of the complementary shared I/O lines at a time from each of the latches (e.g., as represented by the data lines 592 shown in FIG. 5).

As such, with 2048 portions of subarrays each having eight columns (e.g., subarray portion 462-1 of each of subarrays 425-0, 425-1, . . . , 425-N-1), and each configured to couple to a different shared I/O line (e.g., 455-1 through 455-M) 2048 data values (e.g., bits) could be moved to the plurality of shared I/O lines at substantially the same point in time (e.g., in parallel). Accordingly, the present disclosure describes configuring the plurality of shared I/O lines to be at least a thousand bits wide (e.g., 2048 bits wide) to increase the speed, rate, and efficiency of data transfer from sensing circuitry to a controller in a DRAM implementation (e.g., relative to a 64 bit wide data path).

According to some embodiments, a number of cycles for transferring the data from a first row in the subarray portion to the register file (e.g., 576 in FIG. 5) can be configured (e.g., determined) by dividing a number of columns in the array intersected by a row of memory cells in the array by the 2048 bit width of the plurality of shared I/O lines. For example, an array (e.g., a bank, a bank section, and a subarray thereof) can have 16,384 columns, which can correspond to 16,384 data values in a row, which when divided by the 2048 bit width of the plurality of shared I/O lines intersecting the row can yield eight cycles, each separate cycle being at substantially the same point in time (e.g., in parallel) for transfer of all the data in the row. Alternatively or in addition, a bandwidth for transferring the data from a first row in the in the subarray portion to the register file can be configured (e.g., determined) by dividing the number of columns in the array intersected by the row of memory cells in the array by the 2048 bit width of the plurality of shared I/O lines and multiplying the result by a clock rate of the controller 140. In some embodiments, determining a number of data values in a row of the array can be based upon the plurality of sense (digit) lines in the array. In some embodiments, the number of portions of columns (e.g., 462-1, 462-2, . . . , 462-M) in the array (e.g., bank) can correspond to the number of latches (e.g., 461-0, 461-1, . . . , 461-Y-1) in the latch stripe 472, as described in connection with FIGS. 4A and 4B.

According to various embodiments of the present disclosure, a controller (e.g., 140 in FIGS. 1A-1C) can be coupled to a bank (e.g., 121 in FIG. 1C) of a memory device (e.g., 120 in FIG. 1A). The bank can, in various embodiments, include an array of memory cells (e.g., 130 in FIG. 1A). The controller can be configured to execute a command (e.g., 588 described in connection with FIG. 5) to transfer data in the bank from a latch component, e.g., 170 in FIGS. 1A and 1C, in the bank to a register file (e.g., 576 in FIG. 5) in the controller.

The latch component 170 can be coupled to rows (e.g., 119 in FIG. 1B and a corresponding reference number in FIG. 3) of the array via a plurality of columns (e.g., 322 in FIG. 3 and corresponding reference numbers in FIGS. 4A and 4B) of the memory cells. The latch component 170 can include a latch (e.g., 461 in FIGS. 4A and 4B) selectably coupled to each of the columns and configured to implement the command to transfer the data. In various embodiments, the bank can include a data line (e.g., 492-0 and 492-Y-1 in FIGS. 4A and 4B, respectively, and 392 in FIG. 5) and/or shared I/O lines (e.g., 355 in FIG. 3 and corresponding reference numbers in FIGS. 4A and 4B) to couple the latch component 170 to the register file 576 to transfer the data. The controller 140 can be configured to couple to the data line and/or the shared I/O line and the register file to perform a write operation (e.g., as described in connection with FIG. 5) on the transferred data to the register file in the controller.

As described herein, fetch circuitry (e.g., 577 in FIG. 5) associated with the controller 140 can be configured to direct a transfer of particular data from the array. The fetch circuitry can be connected to or form a part of the circuitry of the controller. The transfer of the particular data can include being transferred to a latch stripe (e.g., 172 in FIG. 1B and corresponding reference numbers in FIGS. 4A and 4B) configured to include a number of a plurality of latches (e.g., 461-0, 461-1, . . . , 461-Y-1 in FIGS. 4A and 4B) of the latch component 170 that may correspond to a number of the plurality of portions of the columns (e.g., 462-1, 462-2, . . . , 462-M in FIGS. 4A and 4B) of the memory cells. As described in connection with FIGS. 4A and 4B, the number of the plurality of latches can be selectably coupled to the plurality of data lines 492 and/or shared I/O lines 455 shown in FIGS. 4A and 4B. In some embodiments, the plurality of latches can be selectably coupled to the plurality of data lines and/or shared I/O lines by data transfer control logic (e.g., 578 in FIG. 5).

As described herein (e.g., in connection with FIG. 1B) a particular number of a plurality of latch stripes 472 can correspond to a particular number of a plurality of banks (e.g., banks 121-0, . . . , 121-7) in the memory device. A particular number of a plurality of controllers 140 can correspond to the number of the plurality of banks (e.g., banks 121-0, . . . , 121-7) in the memory device.

Multiplexer circuitry (e.g., 580-581 and 590-592 in FIG. 5) can be configured to selectably transfer data from a particular column of memory cells of the bank by being selectably coupled to, in some embodiments, eight latches in the latch component (e.g., latches 461-0, . . . , 461-7 in FIG. 4A and latches 461-Y-8, . . . , 461-Y-1 in FIG. 4B (not shown)). The latch stripe can include a number of latches configured to transfer an amount of data retrieved from the row of the bank in parallel to a plurality of shared I/O lines (e.g., as described in connection with FIG. 3). As such, the amount of data can correspond to at least a thousand bit width of a plurality of shared I/O lines, where the number of the plurality of shared I/O lines corresponds to a number of bits wide shared I/O line (e.g., 2048 shared I/O lines corresponds to a 2048 bits wide shared I/O line).

As described in connection with FIGS. 3, 4A, and 4B, a latch stripe can be configured to transfer data retrieved from a row of the bank as a plurality of subsets when coupled to a plurality of shared I/O lines. An amount of at least a first subset of the data can correspond to the at least a thousand bit width of the plurality of shared I/O lines. Accordingly, the controller 140 (e.g., in combination with transfer components 171 in FIG. 1A and 571 in FIG. 5) can be configured to transfer the data from a selected row and selected latches in the latch component to the register file in the controller via a plurality of shared I/O lines. As described herein the data transferred from the row can include a register value used for execution of a received set of instructions to perform an operation (e.g., instructions received from a host 110 shown in FIG. 1A).

FIG. 5 is another schematic diagram illustrating circuitry for data transfer in a memory device in accordance with a number of embodiments of the present disclosure. The circuitry for data transfer from sensing circuitry (e.g., 450 in FIGS. 4A and 4B) to the controller described in the present disclosure includes transfer components 571 for the controller 140, as shown in FIG. 1C, that can perform the data transfer operation in multiple stages with coordinated operations. In various embodiments, the operations can be coordinated through sequential execution of coded instructions by a processing resource, as described herein. The coded instructions can be stored as microcode words in at least one of the transfer components 571 of the controller 140 in order to direct a microcode routine. For example, in some embodiments, at least some of the microcode words of the microcode routine can be stored in an operation manager 575 of the transfer components 571.

As used herein, a microcode word is intended to mean one or more microcode words in a microcode routine. The microcode words can include microcode instructions encoded as bits whose values control particular components within a controller (e.g., various ALUs, registers, etc., in controller 140) as well as components outside of the controller (e.g., sensing circuitry 150, latch component 170, operation manager 575, register file 576, fetch circuitry 577, etc.) in order to perform various operations described herein.

A single microcode word may, in various embodiments, include a plurality of bits (e.g., data units). In various instances, the number of bits in each microcode word of a system (e.g., a microcode routine) can depend on the quantity of bits needed to encode all of the possible instructions useable in performing a desired set of sub-operations in the operation. Each bit, or a group of bits, of a microcode word can be used to control different designated system components. For instance, in order to perform a given set sub-operations (e.g., arithmetic operations, bit shifting, etc.) associated with executing a program to perform an operation, 128 bits may, for example, be used to encode all of the possible microcode instructions to control all of the system components associated with performing the desired set of sub-operations in the operation.

As illustrated in FIG. 5, there can, in some embodiments, be four transfer components 571 in the controller 140 in addition to the register file 576. As such, FIG. 5 shows the transfer components 571 to include "control logic" 573, the "operation manager" 575, "fetch circuitry" 577, and "data transfer control logic" 578, in addition to circuitry configured to enable operation of these transfer components 571 in transferring the register value from the sensing circuitry to the register file 576 in the controller. In various embodiments, the transfer components 571, in addition to the register file 576, may be formed on chip with the sensing circuitry 450, including the latch component 170 and the latch stripe 472 thereof, etc., along with the memory array 130, and the associated circuitry, as described herein. In addition, although the transfer components 571 are shown as being separate for clarity, one or more transfer components 571 can, in various embodiments, have circuitry thereof formed in association with (e.g., within circuitry of another transfer component). For example, the data transfer control logic 578 and/or the register file 576 can be formed within the circuitry of the operation manager 575 in some embodiments.

Each of the transfer components 571 described herein can be designed for oversight and/or execution of operations at different levels for implementing instructions (e.g., PIM instructions) for data transfer from the sensing circuitry to the register file in the controller. That is, each transfer component can be designed for control and/or management of logic states to properly execute its own operations and/or for directing a number of associated transfer components' operations.

In one or more embodiments, the control logic 573 can be designed for control of the execution of the PIM instructions issued (e.g., from the host 110) to the controller 140 by controlling a flow of the PIM instructions through the other transfer components 571 of the controller 140. Operations that include a PIM instruction can, for example, be to "add row 57 to row 89 and put the result in row 3", "scale row 892 by the scalar value in register 5", and "branch to the instruction 20 memory addresses before the current one if the loop counter does not equal 0", among others. The control logic 573 can include various units of state information to manage the execution of the PIM instructions. Examples of such state information can, in some embodiments, include register values containing physical memory addresses and/or scalar values that will be used in carrying out the PIM operations. The control logic 573 also can include other functionalities, such as logic to control fetching of PIM instructions (e.g., by the fetch circuitry 577) from the memory array and/or to translate the instructions to targets for the operation manager 575, among others.

The operation manager 575 can be designed for managing the execution of one or more (e.g., a series of, operations). Such operations may be executed at a finer level of granularity (e.g., with more explicit use of hardware structure), than PIM instructions handled by the control logic 573. Such operations can, for example, be to "AND row 30 with the accumulator and put the result in the accumulator", "clear the accumulator", and "move some data in row 3 of subarray 5 to the accumulator in subarray 57", among others.

The operations of the operation manager 575 can be directed through execution of microcode words (e.g., of a microcode routine). The microcode words can, in some embodiments, be retrieved from the memory array and/or stored locally in the operation manager 575 prior to execution. The operation manager 575 can have connections (e.g., data lines 591) to a plurality of latches (e.g., 461-0, 461-1, ..., 461-Y-1 in the latch stripe 472 in FIGS. 4A and 4B). As described herein, the latches can store (cache) data values retrieved from a row in the memory array that include a register value intended to be transferred to the register file 576.

For the operation manager 575 to enable use of the register value stored (cached) in the plurality of latches, the operation manager 575 can be configured with access to microcode and/or logic to enable transfer of the data values, including the register value, from the latches to the register file 576. Hence, the operation manager 575 can be connected 593 (e.g., coupled) to the data transfer control logic 578 of the transfer components 571. In some embodiments, the operation manager 575 can be connected 593 (e.g., coupled) to a logic component 579 (e.g., AND and OR, among other possibilities) of the data transfer control logic 578. As described herein, the data transfer control logic 578 can enable the transfer of data values, including the register value, stored in the latches 461 of the latch stripe 472 to the register file 576. For example, a first multiplexer (Mux 1) 580 selectively coupled to data lines 592 and a second multiplexer (Mux 2) 581 can operate in combination with the logic component 579 connected 594 (e.g., coupled) to the register file 576 to enable the transfer of the data values, including the register value, to the register file 576.

The fetch circuitry 577 can be configured with logic to coordinate requests for changes to the memory array and/or to retrieve (fetch) particular data therefrom, among requests for other operations. For example, the fetch circuitry 577 can be configured to find a specific row of the memory array based upon a command to transfer a register value saved in memory cells in that row. Such a command can come from the HSI 141, control logic 573, and/or the operation manager 575, for example, through data lines 587, 589. After the fetch circuitry 577 determines the specific row and/or memory cells in which the register value is stored, the fetch circuitry 577 can direct a row address select (RAS) component 598 to select the specific row and to retrieve the data values from that specific row within the array. The RAS component 598 can execute signals provided by the fetch circuitry 577 to coordinate timing of a series of operations to properly perform the retrieval of the register value from the memory array and transfer to the register file 576.

To initiate the transfer of data values from the latch component 170 (e.g., the latches 461, latch stripe 472, links 433, and/or link lines 408 thereof) to the register file 576, the control logic 573 can send a command (Cmd) 588 to the operation manager 575. The Cmd 588 can initiate a microcode routine by the operation manager 575. In some embodiments, the control logic 573 can execute a bit in a microcode word to send a control signal to enable (En) line 584 of the logic component 579 of the data transfer control logic 578 associated with the operation manager 575.

A microcode word, labeled "Mux Sel" 585, from the microcode routine can be sent to a first multiplexer (Mux 1) 580 in the data transfer control logic 578. The Mux Sel 585 microcode word can include a bit, or a group of bits, to instruct that Mux 1 580 selects particular data lines 592 and/or selects a sequence of particular data lines as a data path coming from the latch component 170 (e.g., followed by input to Mux 2 581). The fetch circuitry 577 can, in some embodiments, be configured to set the Mux Select Lines 590 for Mux 2 581. In some embodiments, Mux 1 580 can be the same as or can be connected to the multiplexers 460 described in connection with FIGS. 4A and 4B.

A microcode word in the routine can instruct selection of the appropriate address or addresses of the address lines (ADDR) 595 to the register file 576 and the addresses of "Mux Select Lines" 590, which can determine a data path 569 for which data values from the latches 461 and/or latch stripe 472 will be fed from Mux 1 580 to Mux 2 581. A microcode word can be sent that enables (En) 596 as an input line for transfer of the data values, including the register values, from the Mux 2 581 to the register file 576.

A microcode word in the routine can instruct initiation of a fetch operation 589 by being sent from the operation manager 575 to the fetch circuitry 577. The initiation of the fetch operation 589 can cause the fetch circuitry 577 to progress through the series of operations to retrieve an intended row of data values, including the intended register value, from the memory array to the latches (e.g., latches 461-0, 461-1, ..., 461-Y-1 in the latch stripe 472 shown in FIGS. 4A and 4B).

A microcode word in the routine can instruct that an "Idle" signal 587 be sent (e.g., by the operation manager 575 and/or the fetch circuitry 577) to the control logic 573 while the fetch circuitry 577 performs the fetch operation. The Idle signal 587 can instruct the control logic 573 to disable the "En" line 596 into the register file 576 (e.g., either directly or through the operation manager 575, fetch circuitry 577, and/or the data transfer control logic 578). A microcode word can idle a clock (Clk) signal 583 (e.g., connected to the control logic 573 and/or the data transfer control logic 578) that controls progress through the microcode routine, thereby effectively turning the Clk signal 583 off while the fetch circuitry 577 performs the fetch operation.

Prior to the fetch circuitry 577 finding the row that includes the register value, a write enable (Wr En) signal 597 through a line connecting the fetch circuitry 577 to the operation manager 575 has disabled output of Mux 1 580 as input to Mux 2 581, which consequently disables input of data from Mux 2 581 to the register file 576. When the fetch circuitry 577 has retrieved the data values in the row to the latches, the fetch circuitry 577 can send a signal to reverse the Wr En signal 597 and to enable transfer of the data values to the register file 576 via Mux 2 581. A microcode word can cause (e.g., by an instruction to the control logic 573 and/or the data transfer control logic 578) reversal of the Idle signal 587 to reinitiate progress through the microcode routine.

Setting of a number of Mux Select Lines 590 for Mux 2 581, which can correspond to the number of select lines for input of the data values from Mux 1 580, can select the data path coming from the latches 461-0, 461-1, ..., 461-Y-1 of the latch stripe 472 as the input to the register file 576. A microcode word can instruct (e.g., through the operation manager 575) that the register file 576 accept transfer (e.g., input) of the data values by enabling the En line 596 into the register file 576. A microcode word can cause the operation manager 575 to reinitiate progress through the microcode routine, including initiation of a write operation to store the data values, including the register values, in the register file 576.

Accordingly, embodiments of the present disclosure provide a method for operating a memory device to perform data transfer from sensing circuitry to a controller. According to various embodiments, as described herein, the latches 461-0, 461-1, . . . , 461-Y-1 and the controller 140 in a bank 121 of the memory device 120 can be configured to couple via a plurality of data lines 492-0, 492-1, . . . , 492-Y-1 and/or shared I/O lines 455-1, 455-2, . . . , 455-M. The bank in the memory device can include an array of memory cells 130, sensing circuitry 150, 170 coupled to the array via a plurality of sense lines (e.g., 205-1 and 205-2 in FIG. 2 and at corresponding reference numbers in FIGS. 3, 4A, and 4B). The sensing circuitry 150 can include sense amplifiers (e.g., 206 in FIG. 2 and at corresponding reference numbers in FIGS. 3, 4A, and 4B) and a latch component 170, where the latch component can include a plurality of the latches 461-0, 461-1, . . . , 461-Y-1. The controller can be selectably coupled to the array and the plurality of the latches via the plurality of data lines and/or shared I/O lines (e.g., via the circuitry of the transfer component 571 described in connection with FIG. 5).

According to various embodiments, the method can include receiving a Cmd 588 from control logic 573 of the controller to transfer a register value stored in the array to a register file 576 in an operation manager 575 of the controller. As described herein, the register value can be transferred as plurality of subsets to the register file 576 associated with (e.g., in) the operation manager 575 from the selectably coupled latches via the plurality of data lines 492 and/or shared I/O lines 455 (e.g., to be provided by the operation manager 575 for execution of a received set of instructions to perform an operation).

In some embodiments, the Cmd 588 can be sent from the control logic 573 to the operation manager 575 and stored instructions (e.g., a microcode routine) can be accessed by the operation manager 575 for implementation of the transfer. The operation manager can initiate execution of the stored instructions via data transfer control logic 578 and the data transfer control logic can select a first multiplexer 580 (Mux 1) coupled to the latches 461 as a data path 569 for input 592 of the plurality of subsets from Mux 1 580 to a second multiplexer (Mux 2) 581 coupled to the register file 576. In some embodiments, Mux 1 580 can be the same as and/or can be connected (coupled) to multiplexer 460, described in connection with FIGS. 4A and 4B, through Mux Select Lines 590 and/or data lines 591, 592.

The stored instructions (e.g., the microcode routine) can be executed by the operation manager 575 directing that a fetch operation be performed 589 via fetch circuitry 577 and the fetch circuitry 577 initiating the fetch operation for the register value in the array. The stored instructions can be further executed by performing the fetch operation via the fetch circuitry for the register value in the array. An Idle signal 587 can be sent to the control logic 573 to idle a Clk signal 583 (e.g., associated with or in the control logic 573 and/or the data transfer control logic 578) that controls progress through the stored instructions while the fetch circuitry 577 performs the fetch operation. The Idle signal 587, or another signal 574, can be sent (e.g., via the data transfer control logic 578) to disable transfer of the plurality of subsets to the register file 576, via Mux 2 581 coupled to the register file, while the fetch circuitry 577 performs the fetch operation.

The stored instructions (e.g., the microcode routine) can be executed by selecting an address line (e.g., ADDR 595) to the register file, selecting lines 599 of the Mux 2 581 coupled to the register file 576 as the data path for input of particular subsets from Mux 1 460, 580 coupled to the latches. The stored instructions can be further executed by sending a signal 596 to enable transfer of the plurality of subsets to the register file via Mux 2 581.

The stored instructions (e.g., the microcode routine) can be executed by, after finding the register value, the fetch circuitry 577 directing that the register value be retrieved (cached) to the plurality of the latches 461-0, 461-1, . . . , 461-Y-1. The stored instructions can be further executed by the fetch circuitry 577 sending the signal 596 to enable transfer of the plurality of subsets to the register file via Mux 2 581 and the fetch circuitry 577 sending a signal to the control logic 573 that reverses the Idle signal 587 that idled the Clk signal 583 to reinitiate progress through the stored instructions.

The stored instructions (e.g., the microcode routine) can be executed by sending a number of signals (e.g., 596 and/or 598) to enable transfer to the coupled register file 576, via Mux 2 581, of the plurality of subsets of the register value retrieved (cached) to the plurality of latches 461-0, 461-1, . . . , 461-Y-1. The stored instructions can be further executed by sending a signal 597 (e.g., by the control logic 573 and/or the fetch circuitry 577) to the operation manager 575 directing that a write operation be performed to store the plurality of subsets of the register value in the register file 576.

After performing the write operation to the register file 576, a microcode word can instruct the data transfer control logic 578 to decouple the Mux 1 580 coupled 592 to the latches 461 and to decouple the Mux 2 582 selecting lines 599 coupled to the register file 576. A microcode word can instruct the data transfer control logic 578 and/or the operation manager 575 to disable the En 596 input line to the register file 576 and/or disable the signal to perform the write operation in the register file 576. Clearing of the Mux Sel 585 instruction can enable selection of "regular data" (Reg Data) lines 586 (e.g., for data values associated with operations other than transfer of register values) as input to or output from Mux 1 580. The microcode routine can then return to an initial state (e.g., before execution of the transfer was initiated) to await performance of another data transfer from the latches to the controller.

During normal operation (e.g., when a transfer is not occurring between the latches 461 and the register file 576), a microcode word executed by the operation manager 575 can have the Mux Sel 585 state enabled or disabled, depending on the operation. For example, when the Mux Sel 585 state is disabled, Reg Data lines 586 from the operation manager 575 to Mux 1 580 can be selected to enable the operation manager 575 to write local data (e.g., data not transferred from the latches 461) to the register file 576. For example, stored instructions, such as the microcode routine, can be executed by selecting the Mux 1 580 in the data transfer control logic 578, after the Mux 1 580 is decoupled from the latches, to enable the operation manager 575 to store local data in the register file 576.

When the Mux Sel 585 state is enabled (e.g., when a transfer is occurring between the latches 461 and the register file 576), and data is to be transferred to the register file 576 by the operation manager 575 from the latches 461 that is different from the data values already cached in the latches 461, the operation manager 575 can execute a number of microcode words to affect Mux Sel 585 states. For example, this situation may occur when a row of data values has already been cached in the latches 461, as described herein, although a subset of the data in the memory array that is different from that which was initially cached in the latches 461 and/or already stored in the register file 576 is of use to the operation manager 575. Hence, stored instructions, such as the microcode routine, can be executed by interrupting a write operation to store the plurality of subsets (e.g., subsets being transferred from the caches 461) into the register file 576. The stored instructions can be further executed by directing that a different subset of the data retrieved (cached) to the plurality of latches be transferred (e.g., via differential selection of latches 461 through selective coupling of subsets of multiplexers 460-1, 460-2, data lines 492, and/or shared I/O lines 455-1, 455, 2, . . . , 455-M) to the operation manager either for storage in the register file 576 or for another use.

Alternatively or in addition, the stored instructions can be executed by directing that the write operation be interrupted and that a different subset of the data in the memory array, other than that already retrieved, be retrieved (cached) to the plurality of latches (e.g., to replace the data values already retrieved). The stored instructions can be further executed by directing that the new data values be transferred to the operation manager either for storage in the register file 576 or for another use.

According to various embodiments of the present disclosure, a memory device (e.g., 120 in FIG. 1A) can be configured to couple to a host (e.g., 110) via a data bus (e.g., 156) and a control bus (e.g., 154). A bank section in the memory device (e.g., 123 in FIG. 1B) can include an array of memory cells (e.g., 130 in FIG. 1A) and sensing circuitry 150. The array 130 can, in some embodiments, be an array of DRAM memory cells. In some embodiments, the memory device 120 can be configured with a plurality of banks (e.g., 121-0, . . . , 121-7) coupled to a bank arbiter (e.g., 145 in FIG. 1A).

The sensing circuitry 150 shown in FIG. 1A can include sense amplifiers 206 and/or compute components 231 coupled to the array via a plurality of sense lines (e.g., 205-1 and 205-2 in FIG. 2) along with additional latches (latch component) 170, latches 461, latch component links 433, and/or associated link lines 408, as shown in FIGS. 4A and 4B. A controller (e.g., 140) in the memory device can be configured to couple to the array and sensing circuitry. A combination of a shared I/O line (e.g., 455-1 and 455-M in FIGS. 4A and 4B) and a data line (e.g., 492-0 and 492-Y-1 in FIGS. 4A and 4B) in the memory device can be configured to couple a row in a source location (e.g., subarray 0 (425-0) in FIGS. 4A and 4B) through circuitry of a transfer component 171, as described herein, to a register file 576 associated with the controller 140 (e.g., a register file associated with the operation manager 575 connected to or incorporated in the circuitry of the controller). For clarity, FIG. 5 shows register file 576 to be positioned outside the operation manager 575. However, the register file 576 being "associated with" the operation manager 575 is intended to mean that, in some embodiments, the register file 576 may be positioned as such, whereas the register file 576 may be a part of (e.g., located in, physically connected to, and/or contiguous with) the operation manager 575 in some embodiments.

As described herein, the memory device can be configured to include an array of memory cells 130 and the controller 140 with the register file 576 can be selectably coupled to the array 130 via the latch component 170 of the sensing circuitry 150. The controller 140 can be configured to receive a first set of instructions from the host 110 to perform a first operation, where the first operation may rely on state information to manage the execution of the instructions. Examples of such state information can include register values containing, for example, physical memory addresses and/or scalar values that will be used in carrying out the operations.

The controller 140 can be configured to enable execution of the first set of instructions by a second operation that sends a second set of instructions (e.g., initiated by a command, such as Cmd 588 in FIG. 5) to direct that the sensing circuitry (e.g., the latch component 170) retrieves from the array a register value used for the execution of the first set of instructions and transfers the register value to the controller. The memory device can be configured to store the register value in the register file 576 of the controller 140 (e.g., in the operation manager 575).

The sensing circuitry 150, as described herein, can be coupled to the array 130 via a plurality of sense lines (e.g., 205-1 and 205-2 for sense amplifiers) and a plurality of latch component links (e.g., 433 for the latch component 170). As such, the latch component 170 can be configured to retrieve the register value from the array and the sense amplifiers can be configured for other operations.

The latch component 170 can be configured to include a plurality of latches (e.g., 461-0, 461-1, . . . , 461-Y-1 in FIGS. 4A and 4B). The plurality of latches each can be configured with a store (cache) for retrieved data values, including the retrieved register value. The latch component 170 may be formed on chip with the array and to be coupled to the array via a plurality of link lines (e.g., 408 in FIGS. 4A and 4B). The latch component can be configured to transfer data values retrieved from a row, including the register value, as a plurality of subsets when selectably coupled to a plurality of data lines 492 and/or shared I/O lines 455 (e.g., as described in connection with FIGS. 3, 4A, and 4B).

A number of multiplexers (e.g., 460-1 and 460-2 in FIGS. 4A and 4B and/or 580 and 581 in FIG. 5) can be configured to determine data values (e.g., 590-592 in FIG. 5) including the register value, stored (cached) by a subset of selected latches in the latch component to be input to the plurality of data lines and/or shared I/O lines. The register file can be configured to store the register value received as subsets of data values input to the plurality of data lines and/or shared I/O lines (e.g., 595-597 in FIG. 5).

A memory device (e.g., 120 in FIG. 1A) can be configured to include an operation manager 575 with a register file 576 (e.g., the register file 576 can be coupled to and/or formed within the circuitry of the operation manager 575). The operation manager 575 can be located in a controller 140 that may be on chip with the array 130 and selectably coupled to the array via a latch component 170.

The operation manager 575 can be configured to execute a first Cmd 588 from the controller 140 (e.g., via the control logic 573 of the controller) to transfer a register value in a bank 121 via the latch component 170 to the register file 576, which can, in some embodiments, be located in the operation manager 575. The operation manager 575 can be configured to issue a second Cmd 589 to fetch circuitry 577 configured to direct a retrieval of the register value from the bank to the plurality of latches 461-0, 461-1, . . . , 461-Y-1 of the latch component 170. The operation manager 575 can be configured to transfer (e.g., via data transfer control logic 578 coupled to and/or formed within the circuitry of the operation manager 575) from the plurality of latches the register value as subsets of data values input to a plurality of data lines 492 and/or shared I/O lines 455. The operation manager 575 also can be configured to store the transferred register value in the register file 576 to be provided for execution of a received set of instructions (e.g., from the host 110, to perform an operation).

In some embodiments, the latch component 170 can be configured with a number of latches therein (e.g., latches 461-0, 461-1, . . . , 461-Y–1 in FIGS. 4A and 4B) configured to selectably transfer (e.g., via the data transfer control logic 578) cached data sensed from a particular row of memory cells by being selectably coupled to a data lines 492 and/or shared I/O line 455. For example, a particular number of shared I/O lines formed in the array can be configured (e.g., determined) by division of a number of columns (e.g., 322-0 in FIG. 3 and corresponding numbers in FIGS. 4A and 4B) in the array by the eight latches in the latch component selectably coupled to the shared I/O line. The array 130 can, in some embodiments, include a column of memory cells having a pair of complementary sense lines (e.g., 205-1 and 205-2 in FIG. 2 and corresponding numbers in FIGS. 3, 4A, and 4B) and the latch component 170 can include a latch (e.g., 461-0) selectably coupled, via latch component link 433-0, to each of the pair of complementary sense lines. A multiplexer (e.g., Mux 1 580 coupled to and/or formed within the circuitry of the data transfer control logic 578) can be configured to select a latch of the plurality of latches (e.g., latch 461-0 of latches 461-0, 461-1, . . . , 461-Y–1 for portion 462-1) to couple to the link line 408 and/or shared I/O line 455.

As described herein, the operation manager 575 can direct (e.g., by microcode words and/or data transfer control logic 578) fetch circuitry 577 to execute a fetch operation for the register value from a particular row of the array and the operation manager can be selectably coupled to the latches (e.g., via the data transfer control logic 578) for the transfer of the register value to the register file 576. The operation manager 575 can be configured to provide the stored register value for execution of the set of instructions received from a host 110, where the set of instructions can be executed without an additional retrieval operation for the register value in the array.

Each of a plurality of banks (e.g., 121-0, . . . , 121-7) can separately be configured with an operation manager 575 (e.g., coupled to and/or located in an individual controller for a particular bank) to execute a command to transfer register values in that bank from a latch component 170 to a register file 576 in that bank. The bank arbiter 145 can be configured to receive the set of instructions from the host 110 to perform the operation, pass command instructions (e.g., via the control bus 154 of HSI 141) to execute the set of instructions to the controller 140 in at least one of the plurality of banks. The bank arbiter 145 can be configured to aggregate status of the execution of the set of instructions, via use of the register value stored in the register file 576, from at least one of the plurality of banks (e.g., received via the OOB bus 157 of HSI 141) to report back to the channel controller 143 of the host 110.

The apparatuses and methods for data transfer in a memory device from sensing circuitry to a controller described herein enable efficient transfer of data from a latch component (e.g., including latches functioning as peripheral amplifiers, as described herein) to a register file, which may yield significant savings in time and/or energy expended during the process by the controller and/or the memory array (e.g., a bank of DRAM memory cells, among other types of memory cells). Without the components and processes described herein for data transfer from sensing circuitry to the on chip controller, a user may either transfer desired data values to the on chip controller through a control component from off chip or the desired data values in the memory array may be modified in place. The former approach may involve a transfer from an off chip controller to the on chip controller for each desired data value, such inter-chip transfers possibly being expensive in time and/or energy. The latter approach may involve operations on entire rows of data in the memory array, even when modifying a small data value (e.g., 16 bits), possibly being expensive in both time and/or energy. As such, these two approaches may both be expensive in time and/or energy, which may be reduced by the data transfer from the sensing circuitry to the controller described herein.

While example embodiments including various combinations and configurations of controllers, sensing circuitry, sense amplifiers, latch components, transfer circuitry, data lines, shared I/O lines, multiplexers, register values, register files, etc., have been illustrated and described herein, embodiments of the present disclosure are not limited to those combinations explicitly recited herein. Other combinations and configurations of the controllers, sensing circuitry, sense amplifiers, latch components, transfer circuitry, data lines, shared I/O lines, multiplexers, register values, register files, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells comprising a plurality of columns and a plurality of rows;
   a plurality of sense amplifiers coupled to the array of memory cells, wherein a respective sense amplifier is coupled to each column of the array of memory cells;
   a latch component selectably coupled to each respective sense amplifier and configured to store data retrieved from the array of memory cells; and
   a controller coupled to the array of memory cells via the latch component, wherein the controller comprises a register file and is configured to:

execute a command to transfer data from the latch component to the register file;
receive the data from the latch component; and
store the data to the register file; and
wherein the latch component is positioned between the plurality of sense amplifiers and the controller, and is further configured to implement the command to transfer data from the latch component to the register file.

2. The apparatus of claim 1, wherein the latch component is selectably coupled to the register file circuitry via a data line.

3. The apparatus of claim 1, wherein the apparatus further comprises a latch stripe including a plurality of latches of the latch component selectably coupled to corresponding a plurality of link lines for the plurality of columns; and
wherein the controller further comprises fetch circuitry configured to direct transfer of particular data from the array of memory cells to the latch stripe.

4. The apparatus of claim 1, further comprising:
a plurality of latch stripes;
a plurality of banks, wherein a quantity of the plurality of latch stripes corresponds to a quantity of the plurality of banks; and
a plurality of controllers corresponding to the quantity of the plurality of banks.

5. The apparatus of claim 1, wherein the controller further comprises multiplexer circuitry selectably coupled to a plurality of latches of the latch component and configured to selectably transfer data from a particular one of the plurality of columns.

6. The apparatus of claim 1, wherein the latch component further comprises a latch stripe including a plurality of latches in parallel with a plurality of shared I/O lines and configured to transfer an amount of data retrieved from one of the plurality of rows,
wherein the amount of data corresponds to at least a thousand bit width of the plurality of shared I/O lines.

7. The apparatus of claim 1, wherein the controller is further configured to transfer the data from a selected one of the plurality of rows and corresponding selected latches of the latch component to the register file via a plurality of data lines.

8. An apparatus, comprising:
an array of memory cells comprising a plurality of pairs of complementary sense lines;
a respective sense amplifier directly coupled to each pair of complementary sense lines of the array of memory cells;
a latch component selectably coupled to the plurality of pairs of complementary sense lines via the sense amplifiers; and
a controller coupled to the latch component and comprising a register file configured to store a register value retrieved from the array of memory cells, wherein the latch component is positioned peripherally to and between the sense amplifiers and the controller, and wherein the controller is configured to:
receive a first set of instructions to perform an operation;
execute the first set of instructions by retrieval of a second set of instructions from a component of the controller;
execute the second set of instructions to direct:
retrieval of the register value from the array of memory cells by the latch component; and
selectable transfer of the register value from the latch component to the register file; and
receive the register value from the latch component.

9. The apparatus of claim 8, further comprising sensing circuitry coupled to the array of memory cells and comprising the latch component and the sense amplifiers.

10. The apparatus of claim 8, wherein the latch component comprises a plurality of latches configured to store the register value retrieved from the array of memory cells.

11. The apparatus of claim 8, wherein the latch component is configured to selectably transfer the register value retrieved from a row of the array of memory cells when selectably coupled to a plurality of shared I/O lines.

12. The apparatus of claim 8, wherein the controller further comprises a multiplexer configured to determine data values, including the register value, stored by selected latches of the latch component to be selectably input to a plurality of data lines.

13. The apparatus of claim 8, wherein the register file circuitry is further configured to store the register value as subsets of data values input to a plurality of shared I/O lines.

14. An apparatus, comprising:
an array of memory cells;
sense amplifiers coupled to respective pairs of complementary sense lines of the array of the memory cells;
a latch component comprising a plurality of latches selectably coupled to each respective pair of complementary sense lines via the sense amplifiers; and
a controller selectably coupled to the array of memory cells via the latch component, wherein the latch component is separate from and between the controller and the sense amplifiers, and
wherein the controller comprises:
a register file configured to store a register value;
an operation manager configured to execute a first command to transfer the register value from the latch component to the register file; and
fetch circuitry configured to execute a second command, issued by the operation manager, retrieve the register value from at least one of the plurality of latches of the latch component.

15. The apparatus of claim 14, wherein the operation manager is further configured to selectably transfer the register value as data values input to a plurality of data lines via a multiplexer configured to select a latch of the plurality of latches to couple to a shared I/O line, wherein the register value is to be provided for execution of a received set of instructions to perform an operation.

16. The apparatus of claim 14, wherein the plurality of latches of the latch component are configured to selectably transfer cached data sensed from a particular row of the array of memory cells by being selectably coupled to a data line.

17. The apparatus of claim 14, wherein the operation manager is further configured to provide the register value for execution of a set of instructions received from a host; and
wherein the controller is configured to execute the set of instructions without an additional retrieval operation for the register value from the array of memory cells.

18. The apparatus of claim 14, wherein the operation manager is further configured to direct the fetch circuitry to execute a fetch operation for the register value from a particular row of the array; and
wherein the operation manager is selectably coupled to the plurality of latches to transfer the register value from the latch component to the register file.

19. The apparatus of claim 14, wherein the array of memory cells includes a column of memory cells including a pair of complementary sense lines; and wherein the at least one of the plurality of latches of the latch component is selectably coupled to the pair of complementary sense lines.

\* \* \* \* \*